(12) United States Patent  (10) Patent No.: US 9,011,994 B2
Hasegawa et al.  (45) Date of Patent: Apr. 21, 2015

(54) GAS-BARRIER MULTILAYER FILM

(75) Inventors: Akira Hasegawa, Ibaraki (JP); Toshiya Kuroda, Ibaraki (JP); Masamitsu Ishitobi, Ibaraki (JP); Takashi Sanada, Chiba (JP); Toshihiko Tanaka, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 166 days.

(21) Appl. No.: 13/263,278

(22) PCT Filed: Apr. 8, 2010

(86) PCT No.: PCT/JP2010/056399
§ 371 (c)(1),
(2), (4) Date: Nov. 3, 2011

(87) PCT Pub. No.: WO2010/117046
PCT Pub. Date: Oct. 14, 2010

(65) Prior Publication Data
US 2012/0040107 A1    Feb. 16, 2012

(30) Foreign Application Priority Data

Apr. 9, 2009  (JP) .................................. 2009-094714
Sep. 1, 2009  (JP) .................................. 2009-201328

(51) Int. Cl.
*C09K 19/00*  (2006.01)
*C23C 16/54*  (2006.01)
(Continued)

(52) U.S. Cl.
CPC ............. *C23C 16/545* (2013.01); *C23C 16/401* (2013.01); *C23C 16/505* (2013.01);
(Continued)

(58) Field of Classification Search
CPC .. C23C 16/401; C23C 16/402; C23C 16/503; C23C 16/505; C23C 16/545; C23C 16/515; H01L 51/5237; H01L 51/5253; H01L 51/5256; B05D 2490/50
USPC ......... 428/1.5, 1.51, 34.6, 702; 313/493, 512, 313/506; 427/569, 574, 578, 579, 588, 583, 427/255.18, 255.393, 255.394, 255.37
See application file for complete search history.

(56) References Cited

U.S. PATENT DOCUMENTS 6,268,695 B1   7/2001  Affinito
6,522,067 B1   2/2003  Graff et al.
(Continued)

FOREIGN PATENT DOCUMENTS

JP      04-089236 A      3/1992
JP      2002-192646 A    7/2002
(Continued)

OTHER PUBLICATIONS

International Preliminary Report on Patentability for corresponding International Patent Application No. PCT/JP2010/056399 mailed Nov. 24, 2011.
(Continued)

*Primary Examiner* — Gwendolyn Blackwell
*Assistant Examiner* — Ruiyun Zhang
(74) *Attorney, Agent, or Firm* — Sughrue Mion, PLLC

(57) ABSTRACT

A gas-barrier multilayer film including:
a base member; and
at least one thin film layer formed on at least one surface of the base member, wherein
at least one layer of the thin film layer(s) satisfies at least one of requirements (A) and (B).

29 Claims, 19 Drawing Sheets

(51) Int. Cl.
  *C23C 16/40* (2006.01)
  *C23C 16/505* (2006.01)
  *B32B 15/08* (2006.01)
  *B32B 27/32* (2006.01)
  *B32B 27/36* (2006.01)
  *H01L 51/44* (2006.01)
  *H01L 51/52* (2006.01)

(52) U.S. Cl.
  CPC .......... *H01L 51/448* (2013.01); *H01L 51/5237* (2013.01); *B32B 15/08* (2013.01); *B32B 27/32* (2013.01); *B32B 27/36* (2013.01)

(56) References Cited

U.S. PATENT DOCUMENTS

| | | |
|---|---|---|
| 2001/0038894 A1 | 11/2001 | Komada |
| 2004/0046497 A1 | 3/2004 | Schaepkens et al. |
| 2005/0019503 A1 | 1/2005 | Komada |
| 2005/0218803 A1 | 10/2005 | Takeuchi et al. |
| 2009/0148633 A1 | 6/2009 | Inagaki et al. |
| 2012/0040107 A1 | 2/2012 | Hasegawa et al. |

FOREIGN PATENT DOCUMENTS

| | | |
|---|---|---|
| JP | 2005-285659 A | 10/2005 |
| JP | 2006-342423 A | 12/2006 |
| JP | 2010260347 A | 11/2010 |
| WO | 00/36665 A1 | 6/2000 |
| WO | 2004/025749 A2 | 3/2004 |
| WO | WO 2006090602 A1 * | 8/2006 |

OTHER PUBLICATIONS

Japanese Office Action issued in corresponding JP Application No. 2010-089843, dated Dec. 13, 2013.

* cited by examiner

GAS-BARRIER MULTILAYER FILM

CROSS REFERENCE TO RELATED APPLICATION

This application is a National Stage of International Application No. PCT/JP2010/056399 filed Apr. 8, 2010, claiming priority based on Japanese Patent Application No. 2009-094714, filed Apr. 9, 2009, and Japanese Patent Application No. 2009-201328, filed Sep. 1, 2009, the contents of all of which are incorporated herein by reference in their entirety.

TECHNICAL FIELD

The present invention relates to a gas-barrier multilayer film suitably usable for flexible lighting devices using organic electroluminescent elements (organic EL elements), organic thin film solar cells, liquid crystal displays, packaging containers for pharmaceuticals, and the like.

BACKGROUND ART

Gas barrier films can be used suitably for packaging containers suitable for filling packaging of articles such as foods, beverages, cosmetics, and detergents. Recently, a gas barrier film has been proposed which is produced by forming a thin film of an inorganic oxide such as silicon oxide, silicon nitride, silicon oxynitride, or aluminum oxide on one surface of a base film such as a plastic film.

As a method for forming such a thin film of an inorganic oxide on a surface of a plastic base member, physical vapor deposition (PVD) methods such as the vacuum deposition method, the sputtering method, and the ion plating method, as well as chemical vapor deposition (CVD) methods such as the low pressure chemical vapor deposition and the plasma enhanced chemical vapor deposition method have been known. Meanwhile, as an example of gas barrier films produced by using such a method for producing a film, Japanese Unexamined Patent Application Publication No. Hei 4-89236 (Patent Literature 1) discloses a gas barrier film provided with a multilayer vapor deposition film layer in which two or more silicon oxide vapor deposition films are laminated on a surface of a plastic base member.

CITATION LIST

Patent Literature

[PTL 1] Japanese Unexamined Patent Application Publication No. Hei 4-89236

SUMMARY OF INVENTION

Technical Problem

The gas barrier film as described in Patent Literature 1 can be used as a gas barrier film for articles such as foods, beverages, cosmetics, and detergents for which even relatively low gas barrier properties are satisfactory. However, the gas barrier film is not necessarily sufficient in terms of gas barrier properties as a gas barrier film for electronic devices such as organic EL elements and organic thin film solar cells. Moreover, the gas barrier film as described in Patent Literature 1 has a problem that the gas barrier properties thereof against oxygen gas and water vapor degrade when the film is bent. Hence, when seen as a gas barrier film required to have anti-bending properties as in the case of a flexible liquid crystal display, the gas barrier film as described in Patent Literature 1 is not necessarily sufficient in terms of the gas barrier properties in a case where the film is bent.

The present invention has been made in view of the above-described problems of the conventional techniques, and an object of the present invention is to provide a gas-barrier multilayer film which has sufficient gas barrier properties, and moreover which makes it possible to sufficiently suppress the degradation in gas barrier properties even when the film is bent.

Solution to Problem

The present inventors made earnest study to achieve the above object, and consequently have found the following fact. Specifically, in a gas-barrier multilayer film comprising a base member, and at least one thin film layer formed on at least one side of the base member, at least one layer of the thin film layer(s) is made to be a layer which contains silicon, oxygen, and carbon, and which has a silicon distribution curve, an oxygen distribution curve, and a carbon distribution curve that satisfy the following requirements (i) to (iii), each of the silicon distribution curve, the oxygen distribution curve, and the carbon distribution curve representing a relationship between the distance from a surface of the thin film layer in the film thickness direction of the layer and corresponding one of the atomic ratio of silicon, the atomic ratio of oxygen, and the atomic ratio of carbon to the total amount of silicon atoms, oxygen atoms, and carbon atoms, and/or a layer whose electron beam transmittance curve has an extremum, the electron beam transmittance curve representing a relationship between the distance from a surface of the thin film layer in the film thickness direction of the layer and the electron beam transmittance. In such a case, astonishingly, a gas-barrier multilayer film can be obtained which has sufficient gas barrier properties, and which makes it possible to sufficiently suppress the degradation in gas barrier properties even when the film is bent. This finding has led to the accomplishment of the present invention.

Specifically, a gas-barrier multilayer film of the present invention is a gas-barrier multilayer film comprising:
 a base member; and
 at least one thin film layer formed on at least one surface of the base member, wherein
 at least one layer of the thin film layer (s) satisfies at least one of the following requirements (A) and (B):
[Requirement (A)]
 the layer contains silicon, oxygen, and carbon, and
 in a silicon distribution curve, an oxygen distribution curve, and a carbon distribution curve all the following requirements (i) to (iii) are satisfied, each of the silicon distribution curve, the oxygen distribution curve, and the carbon distribution curve representing the relationship between the distance from a surface of the layer in the film thickness direction of the layer and corresponding one of the ratio of the amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):
 (i) the atomic ratio of silicon, the atomic ratio of oxygen, and the atomic ratio of carbon satisfy, in any region corresponding to 90% or more of the thickness of the layer, a requirement represented by the following formula (1):

(atomic ratio of oxygen)>(atomic ratio of silicon)>
(atomic ratio of carbon)  (1), or the atomic ratio of silicon, the atomic ratio of oxygen, and the atomic ratio of carbon satisfy, in any region corresponding to 90% or more of the thickness of the layer, a requirement represented by the following formula (2):

(atomic ratio of carbon)>(atomic ratio of silicon)>
(atomic ratio of oxygen)  (2); and (ii) the carbon distribution curve has at least one extremum; and (iii) the absolute value of the difference between the maximum value and the minimum value of the atomic ratio of carbon in the carbon distribution curve is 5 at % or greater; and

[Requirement (B)]

an electron beam transmittance curve has at least one extremum, the electron beam transmittance curve representing the relationship between the distance from a surface of the layer in the film thickness direction of the layer and the electron beam transmittance.

In addition, in the gas-barrier multilayer film of the present invention, preferably, said at least one layer of the thin film layer(s) satisfies the requirement (A), and the carbon distribution curve of said layer is substantially continuous.

Additionally, in the gas-barrier multilayer film of the present invention, preferably, said at least one layer of the thin film layer(s) satisfies the requirement (A), and the oxygen distribution curve of said layer has at least one extremum.

Moreover, in the gas-barrier multilayer film of the present invention, preferably, said at least one layer of the thin film layer(s) satisfies the requirement (A), and the absolute value of the difference between the maximum value and the minimum value of the atomic ratio of oxygen in the oxygen distribution curve of said layer is 5 at % or greater.

Further, in the gas-barrier multilayer film of the present invention, preferably, said at least one layer of the thin film layer (s) satisfies the requirement (A), and the absolute value of the difference between the maximum value and the minimum value of the atomic ratio of silicon in the silicon distribution curve of said layer is smaller than 5 at %.

Furthermore, in the gas-barrier multilayer film of the present invention, preferably, said at least one layer of the thin film layer(s) satisfies the requirement (A), and the absolute value of the difference between the maximum value and the minimum value of the total atomic ratio of oxygen and carbon in an oxygen-carbon distribution curve is smaller than 5 at %, the oxygen-carbon distribution curve representing the relationship between the distance from the surface in the film thickness direction of the layer and the ratio of the total amount of oxygen atoms and carbon atoms to the total amount of silicon atoms, oxygen atoms, and carbon atoms (the atomic ratio of oxygen and carbon).

Besides, in the gas-barrier multilayer film of the present invention, preferably, said at least one layer of the thin film layer(s) satisfies the requirement (A), and the carbon distribution curve of said layer has at least three extrema. In such a case, preferably, the absolute value of the difference in distance from the surface of the thin film layer in the film thickness direction of the thin film layer between each of the extrema of the carbon distribution curve and any one of the extrema adjacent to the former one is 200 nm or less. Specifically, in the gas-barrier multilayer film of the present invention, more preferably, said at least one layer of the thin film layer(s) satisfies the requirement (A), the carbon distribution curve of said layer has at least three extrema, and the absolute value of the difference in distance from the surface of the thin film layer in the film thickness direction of the thin film layer between each of the extrema of the carbon distribution curve and any one of the extrema adjacent to the former one is 200 nm or less.

In addition, in the gas-barrier multilayer film of the present invention, preferably, said at least one layer of the thin film layer(s) satisfies the requirement (A), and the oxygen distribution curve of said layer has at least three extrema. In such a case, preferably, the absolute value of the difference in distance from the surface of the thin film layer in the film thickness direction of the thin film layer between each of the extrema of the oxygen distribution curve and any one of the extrema adjacent to the former one is 200 nm or less. Specifically, in the gas-barrier multilayer film of the present invention, more preferably, said at least one layer of the thin film layer(s) satisfies the requirement (A), the oxygen distribution curve of said layer has at least three extrema, and the absolute value of the difference in distance from the surface of the thin film layer in the film thickness direction of the thin film layer between each of the extrema of the oxygen distribution curve and any one of the extrema adjacent to the former one is 200 nm or less.

Additionally, in the gas-barrier multilayer film of the present invention, preferably, said at least one layer of the thin film layer(s) satisfies the requirement (B), and the electron beam transmittance curve of said layer is substantially continuous.

Moreover, in the gas-barrier multilayer film of the present invention, preferably, said at least one layer of the thin film layer(s) satisfies the requirement (B), and the electron beam transmittance curve of said layer has at least three extrema. In such a case, preferably, the absolute value of the difference in distance from the surface of the thin film layer in the film thickness direction of the thin film layer between each of the extrema of the electron beam transmittance curve and any one of the extrema adjacent to the former one is 200 nm or less. Specifically, in the gas-barrier multilayer film of the present invention, more preferably, said at least one layer of the thin film layer(s) satisfies the requirement (B), the electron beam transmittance curve of said layer has at least three extrema, and the absolute value of the difference in distance from the surface of the thin film layer in the film thickness direction of the thin film layer between each of the extrema of the electron beam transmittance curve and any one of the extrema adjacent to the former one is 200 nm or less.

Further, in the gas-barrier multilayer film of the present invention, preferably, said at least one layer of the thin film layer(s) satisfies the requirement (B), and said layer contains silicon oxide as a main component. In such a case, preferably, said layer contains substantially no nitrogen.

Furthermore, in the gas-barrier multilayer film of the present invention, said at least one layer of the thin film layer(s) may satisfy the requirement (B), and said layer may contain silicon nitride as a main component. Additionally, in the gas-barrier multilayer film of the present invention, preferably, said at least one layer of the thin film layer(s) satisfies the requirement (B), and the layer contains carbon.

Besides, in the gas-barrier multilayer film of the present invention, preferably, said at least one layer of the thin film layer(s), which satisfies at least one of the requirements (A) and (B), has a thickness of 5 to 3000 nm.

In addition, in the gas-barrier multilayer film of the present invention, preferably, said at least one layer of the thin film layer(s), which satisfies at least one of the requirements (A) and (B), is a layer formed by a plasma enhanced chemical vapor deposition method. Moreover, in the gas-barrier multilayer film of the present invention, more preferably, the at least one of the thin film layers, which satisfies at least one of the requirements (A) and (B), is a layer formed by a plasma enhanced chemical vapor deposition method in which the base member is placed on a pair of film forming rolls and plasma is generated by performing discharge between the pair of film forming rolls. Further, preferably, the polarities of the pair of film forming rolls are reversed alternately during the discharge between the pair of film forming rolls. Furthermore, preferably, a film-forming gas to be used in the plasma enhanced chemical vapor deposition method contains an organosilicon compound and oxygen, and, preferably, the content of the oxygen in the film-forming gas is not more than a theoretical amount of oxygen necessary to completely oxidize the entire amount of the organosilicon compound in the film-forming gas. Besides, in the gas-barrier multilayer film of the present invention, preferably, said at least one layer of the thin film layer(s), which satisfies at least one of the requirements (A) and (B), is a layer formed by a continuous film formation process. Note that, the plasma enhanced chemical vapor deposition method may be a plasma enhanced chemical vapor deposition method of the penning discharge plasma system.

Additionally, in the gas-barrier multilayer film of the present invention, preferably, the base member is made of at least one resin selected from the group consisting of polyester-based resins and polyolefin-based resins, and more preferably, the base member is made of at least one resin selected from the group consisting of polyethylene terephthalate and polyethylene naphthalate.

In addition, an organic electroluminescent element, an organic thin film solar cell, and a liquid crystal display of the present invention each comprise the above-described gas-barrier multilayer film of the present invention. As described above, the gas-barrier multilayer film of the present invention can be suitably used for organic electroluminescent elements, organic thin film solar cells, and liquid crystal displays.

Advantageous Effects of Invention

The present invention makes it possible to provide a gas-barrier multilayer film which has sufficient gas barrier properties, and which makes it possible to sufficiently suppress the degradation in gas barrier properties even when the film is bent.

DESCRIPTION OF EMBODIMENTS

Figure 1:
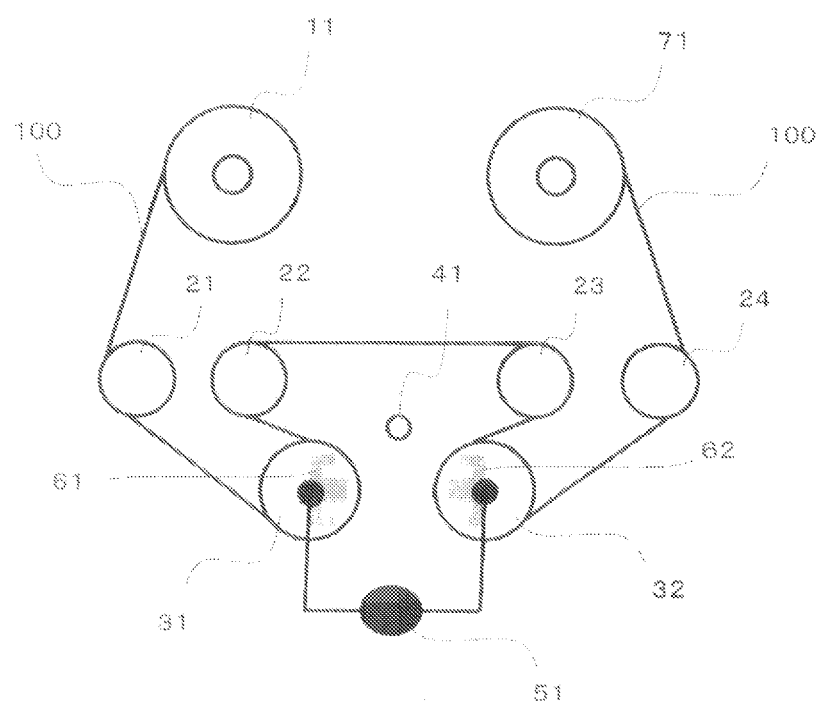
FIG. 1 is a schematic diagram showing an embodiment of a manufacturing apparatus which can be used suitably in producing a gas-barrier multilayer film of the present invention.

Hereinafter, the present invention will be described in detail on the basis of preferred embodiments thereof.

A gas-barrier multilayer film of the present invention is a gas-barrier multilayer film comprising:
   a base member; and
   at least one thin film layer formed on at least one surface of the base member, wherein
   at least one layer of the thin film layer(s) satisfies at least one of the following requirements (A) and (B):
[Requirement (A)]
   the layer contains silicon, oxygen, and carbon, and
   in a silicon distribution curve, an oxygen distribution curve, and a carbon distribution curve all the following requirements (i) to (iii) are satisfied, each of the silicon distribution curve, the oxygen distribution curve, and the carbon distribution curve representing the relationship between the distance from a surface of the layer in the film thickness direction of the layer and corresponding one of the ratio of the amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):
   (i) the atomic ratio of silicon, the atomic ratio of oxygen, and the atomic ratio of carbon satisfy, in any region corresponding to 90% or more of the thickness of the layer, a requirement represented by the following formula (1):

(atomic ratio of oxygen)>(atomic ratio of silicon)>(atomic ratio of carbon)  (1), or the atomic ratio of silicon, the atomic ratio of oxygen, and the atomic ratio of carbon satisfy, in any region corresponding to 90% or more of the thickness of the layer, a requirement represented by the following formula (2):

(atomic ratio of carbon)>(atomic ratio of silicon)>(atomic ratio of oxygen)  (2); and (ii) the carbon distribution curve has at least one extremum; and
   (iii) the absolute value of the difference between the maximum value and the minimum value of the atomic ratio of carbon in the carbon distribution curve is 5 at % or greater; and
[Requirement (B)]
   an electron beam transmittance curve has at least one extremum, the electron beam transmittance curve representing the relationship between the distance from a surface of the layer in the film thickness direction of the layer and the electron beam transmittance. Hereinafter, descriptions will be given separately of the base member; the gas-barrier, multilayer film (hereinafter, simply referred to as a "gas-barrier multilayer film (A)" in some cases), which is suitable as the gas-barrier multilayer film of the present invention and which has at least one of the thin film layer(s) satisfying the requirement (A); and the gas-barrier multilayer film (hereinafter, simply referred to as a "gas-barrier multilayer film (B)" in some cases), which is suitable as the gas-barrier multilayer film of the present invention, and which has at least one of the thin film layer(s) satisfying the requirement (B).

(Base Member)

Examples of the base member used in the present invention include films and sheets made of colorless and transparent resins. Examples of the resins used in such a base member include polyester-based resins such as polyethylene terephthalate (PET), and polyethylene naphthalate (PEN); polyolefin-based resins such as polyethylene (PE), polypropylene (PP), and cyclic polyolefins; polyamide-based resins; polycarbonate-based resins; polystyrene-based resins; polyvinyl alcohol-based resins; saponified products of ethylene-vinyl acetate copolymers; polyacrylonitrile-based resins; acetal-based resins; and polyimide-based resins. Among these resins, polyester-based resins and polyolefin-based resins are preferable, and PET and PEN are particularly preferable, from the viewpoints of high heat resistance, high coefficient of linear expansion, and low production costs. These resins can be used alone or two or more of them can be used in combination.

The thickness of the base member can be set as appropriate in consideration of stability during the production of the gas-barrier multilayer film of the present invention. The thickness of the base member is preferably in a range from 5 to 500 μm from the viewpoint that the film can be transferred even in vacuum. Moreover, when the thin film layer according to the present invention is formed by a plasma enhanced CVD method, the thickness of the base member is more preferably in a range from 50 to 200 μm, and particularly preferably in a range from 50 to 100 μm. This is because discharge is performed through the base member in formation of the thin film layer according to the present invention.

In addition, the base member is preferably subjected to a surface activation treatment to make the surface of the base member clean from the viewpoint of adhesion with the thin film layer to be described later. Examples of such a surface activation treatment include corona treatment, plasma treatment, and flame treatment.

(Gas-Barrier Multilayer Film (A))

A gas-barrier multilayer film (A) suitable as a gas-barrier multilayer film of the present invention comprises: the base member; and at least one or more thin film layers formed on at least one surface of the base member, wherein at least one layer of the thin film layer(s) contains silicon, oxygen, and carbon, and in a silicon distribution curve, an oxygen distribution curve, and a carbon distribution curve all the following requirements (i) to (iii) are satisfied, each of the silicon distribution curve, the oxygen distribution curve, and the carbon distribution curve representing the relationship between the distance from a surface of the layer in the film thickness direction of the layer and corresponding one of the ratio of an amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):

(i) the atomic ratio of silicon, the atomic ratio of oxygen, and the atomic ratio of carbon satisfy, in any region corresponding to 90% or more of the thickness of the layer, a requirement represented by the following formula (1):

(atomic ratio of oxygen)>(atomic ratio of silicon)>(atomic ratio of carbon)  (1), or the atomic ratio of silicon, the atomic ratio of oxygen, and the atomic ratio of carbon satisfy, in any region corresponding to 90% or more of the thickness of the layer, a requirement represented by the following formula (2):

(atomic ratio of carbon)>(atomic ratio of silicon)>(atomic ratio of oxygen)  (2); and (ii) the carbon distribution curve has at least one extremum; and (iii) the absolute value of the difference between the maximum value and the minimum value of the atomic ratio of carbon in the carbon distribution curve is 5 at % or greater.

Such a thin film layer is a layer formed on at least one side of the base member. In such a gas-barrier multilayer film (A), at least one layer of the thin film layer(s) needs to be a layer containing silicon, oxygen, and carbon. Moreover, said at least one layer of the thin film layer(s) may further contain nitrogen and/or aluminum.

Moreover, in the gas-barrier multilayer film (A), at least one layer of the thin film layer(s) containing silicon, oxygen, and carbon satisfies all the above-described requirements (i) to (iii). In other words, at least one layer of the thin film layer(s) in the gas-barrier multilayer film (A), first of all, is required to satisfy the following. Specifically, in a silicon distribution curve, an oxygen distribution curve, and a carbon distribution curve, each of the silicon distribution curve, the oxygen distribution curve, and the carbon distribution curve representing the relationship between the distance from a surface of the layer in the film thickness direction of the layer and corresponding one of the ratio of the amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):

(i) in any region corresponding to 90% or more (more preferably 95% or more, and particularly preferably 100%) of the thickness of the layer, the atomic ratio of silicon, the atomic ratio of oxygen, and the atomic ratio of carbon satisfy a requirement represented by the following formula (1):

(atomic ratio of oxygen)>(atomic ratio of silicon)>
(atomic ratio of carbon)        (1), or in any region corresponding to 90% or more (more preferably 95% or more, and particularly preferably 100%) of the thickness of the layer, the atomic ratio of silicon, the atomic ratio of oxygen, and the atomic ratio of carbon satisfy a requirement represented by the following formula (2):

(atomic ratio of carbon)>(atomic ratio of silicon)>
(atomic ratio of oxygen)        (2).

If the atomic ratio of silicon, the atomic ratio of oxygen, and the atomic ratio of carbon do not satisfy the requirement, the obtained gas-barrier multilayer film has insufficient gas barrier properties.

Next, in such a thin film layer, (ii) the carbon distribution curve needs to have at least one extremum. In such a thin film layer, the carbon distribution curve has more preferably at least two extrema, and particularly preferably at least three extrema. If the carbon distribution curve has no extremum, the obtained gas-barrier multilayer film exhibits insufficient gas barrier properties, when bent. Moreover, when the carbon distribution curve has at least three extrema as described above, the absolute value of the difference in distance from the surface of the thin film layer in the film thickness direction of the thin film layer between each of the extrema of the carbon distribution curve and any one of the extrema adjacent to the former one is preferably 200 nm or less, and more preferably 100 nm or less. Note that, in the present invention, an extremum refers to a local maximum or a local minimum of the atomic ratio of an element with respect to the distance from a surface of the thin film layer in the film thickness direction of the thin film layer. Moreover, in the present invention, the local maximum refers to a point at which change of the value of the atomic ratio of an element turns from increase to decrease when the distance from the surface of the thin film layer is changed and the value of the atomic ratio of the element decreases by 3 at % or more in comparison to the value of the atomic ratio of the element at that point when the distance from the surface of the thin film layer in the film thickness direction of the thin film layer is further changed by 20 nm from that point. Meanwhile, in the present invention, the local minimum refers to a point at which the change of the value of the atomic ratio of an element turns from decrease to increase when the distance from the surface of the thin film layer is changed and the value of the atomic ratio of the element increases by 3 at % or more in comparison to the value of the atomic ratio of the element at that point when the distance from the surface of the thin film layer in the film thickness direction of the thin film layer is further changed by 20 nm from that point.

Moreover, in such a thin film layer, (iii) the absolute value of the difference between the maximum value and the minimum value of the atomic ratio of carbon in the carbon distribution curve needs to be 5 at % or greater. In addition, in such a thin film layer, the absolute value of the difference between the maximum value and the minimum value of the atomic ratio of carbon is more preferably 6 at % or greater, and particularly preferably 7 at % or greater. If the absolute value is smaller than 5 at %, the gas barrier properties of the obtained gas-barrier multilayer film are insufficient when the film is bent.

In the present invention, the oxygen distribution curve of the thin film layer preferably has at least one extremum, more preferably at least two extrema, and particularly preferably at least three extrema. If the oxygen distribution curve has no extremum, the obtained gas-barrier multilayer film tends to exhibit low gas barrier properties when the film is bent. Moreover, when the oxygen distribution curve has at least three extrema as described above, the absolute value of the difference in distance from the surface of the thin film layer in the film thickness direction of the thin film layer between each of the extrema of the carbon distribution curve and any one of the extrema adjacent to the former one is preferably 200 nm or less, and more preferably 100 nm or less.

Moreover, in the present invention, the absolute value of the difference between the maximum value and the minimum value of the atomic ratio of oxygen in the oxygen distribution curve of the thin film layer is preferably 5 at % or greater, more preferably 6 at % or greater, and particularly preferably 7 at % or greater. If the absolute value is smaller than the lower limit, the gas barrier properties of the obtained gas-barrier multi layer film are low when the film is bent.

In the present invention, the absolute value of the difference between the maximum value and the minimum value of the atomic ratio of silicon in the silicon distribution curve of the thin film layer is preferably smaller than 5 at %, more preferably smaller than 4 at %, and particularly preferably smaller than 3 at %. If the absolute value exceeds the upper limit, the gas barrier properties of the obtained gas-barrier multilayer film tend to decrease.

Moreover, in the present invention, in an oxygen-carbon distribution curve which represents the relationship in at least one of the thin film layer(s) between the distance from the surface of the layer in the film thickness direction and the ratio of the total amount of oxygen atoms and carbon atoms to the total amount of silicon atoms, oxygen atoms, and carbon atoms (the atomic ratio of oxygen and carbon), the absolute value of the difference between the maximum value and the minimum value of the total atomic ratio of oxygen and carbon is preferably smaller than 5 at %, more preferably smaller than 4 at %, and particularly preferably smaller than 3 at %. If the absolute value exceeds the upper limit, the gas barrier properties of the obtained gas-barrier multi layer film tend to decrease.

The silicon distribution curve, the oxygen distribution curve, the carbon distribution curve, and the oxygen-carbon distribution curve can be produced by the so-called XPS depth profile measurement; in the XPS depth profile measurement, measurement by X-ray photoelectron spectroscopy (XPS) and noble gas ion sputtering using argon or the like are conducted in combination to conduct a sequential surface composition analysis while the inside of a sample is being made to be exposed. A distribution curve obtained by such XPS depth profile measurement can be produced by, for example, taking the atomic ratio of each element (unit: at %) on the vertical axis and the etching time (sputtering time) on the horizontal axis. Note that, in an element distribution curve where the horizontal axis represents the etching time as described above, the etching time approximately correlates to the distance from the surface of the thin film layer in the film thickness direction of the thin film layer in the film thickness direction. Hence, a distance from the surface of the thin film layer calculated from a relationship between the etching rate and the etching time employed in the XPS depth profile measurement can be employed as the "distance from the surface of the thin film layer in the film thickness direction of the thin film layer". Moreover, regarding the sputtering method employed for the XPS depth profile measurement, it is preferable to employ a noble gas ion sputtering method using argon ($Ar^+$) as an etching ion species, and set the etching rate to 0.05 nm/sec (in terms of $SiO_2$ thermally oxidized film).

Moreover, in the present invention, each of the thin film layer(s) in the gas-barrier multilayer film (A) is preferably substantially uniform in the film surface direction (the direction in parallel to a surface of the thin film layer) from the viewpoint of forming a thin film layer having gas barrier properties which are excellent and constant over the entire film surface. In such a gas-barrier multilayer film (A), the phrase "the thin film layer is substantially uniform in the film surface direction" means that when the oxygen distribution curves, the carbon distribution curves, and the oxygen-carbon distribution curves are produced for any two measurement points on the film surface of the thin film layer by XPS depth profile measurement, the carbon distribution curves obtained at the two measurement points have the same number of extrema and the carbon distribution curves have the same absolute value of the difference between the maximum value and the minimum value of the atomic ratio of carbon or have absolute values which are different by 5 at % or less.

Moreover, in the present invention, the carbon distribution curve is preferably substantially continuous. In this DESCRIPTION, the phrase "the carbon distribution curve is substantially continuous" means that no portion exists at which the atomic ratio of carbon changes discontinuously in the carbon distribution curve. Specifically, the relationship between the distance (x, unit: nm) from the surface of the at least one layer of the thin film layer(s) in the film thickness direction of the layer calculated from the etching rate and the etching time, and the atomic ratio of carbon (C, unit: at %) satisfy a requirement represented by the following formula (F1):

$(dC/dx) \leq 0.5$      (F1).

The gas-barrier multilayer film of the present invention needs to have at least one thin film layer satisfying all the requirements (i) to (iii) and may include two or more layers satisfying such requirements. Moreover, when the gas-barrier multilayer film has two or more such thin film layers, the materials of the multiple thin film layers may be the same or different. Moreover, when the gas-barrier multilayer film has two or more such thin film layers, the thin film layers may be formed on one surface of the base member or may be formed on both surfaces of the base member. In addition, the multiple thin film layers may include a thin film layer which does not necessarily have gas barrier properties.

Moreover, when the atomic ratio of silicon, the atomic ratio of oxygen, and the atomic ratio of carbon in the silicon distribution curve, the oxygen distribution curve, and the carbon distribution curves satisfy the requirement represented by the above-described formula (1) in any region corresponding to 90% or more of the film thickness of the layer, the atomic ratio of the content of silicon atoms in the thin film layer to the total amount of silicon atoms, oxygen atoms, and carbon atoms is preferably 25 to 45 at %, and more preferably 30 to 40 at %. In addition, the atomic ratio of the content of oxygen atoms in the thin film layer to the total amount of silicon atoms, oxygen atoms, and carbon atoms is preferably 33 to 67 at %, and more preferably 45 to 67 at %. Moreover, the atomic ratio of the content of carbon atoms in the thin film layer to the total amount of silicon atoms, oxygen atoms, and carbon atoms is preferably 3 to 33 at %, and more preferably 3 to 25 at %.

Moreover, when the atomic ratio of silicon, the atomic ratio of oxygen, and the atomic ratio of carbon in the silicon distribution curve, the oxygen distribution curve, and the carbon distribution curve satisfy the requirement represented by the above-described formula (2) in any region corresponding to 90% or more of the thickness of the layer, the atomic ratio of the content of silicon atoms in the thin film layer to the total amount of silicon atoms, oxygen atoms, and carbon atoms is preferably 25 to 45 at %, and more preferably 30 to 40 at %. In addition, the atomic ratio of the content of oxygen atoms in the thin film layer to the total amount of silicon atoms, oxygen atoms, and carbon atoms is preferably 1 to 33 at %, and more preferably 10 to 27 at %. Moreover, the atomic ratio of the content of carbon atoms in the thin film layer to the total amount of silicon atoms, oxygen atoms, and carbon atoms is preferably 33 to 66 at %, and more preferably 40 to 57 at %.

(Gas-Barrier Multilayer Film (B))

A gas-barrier multilayer film (B) suitable as a gas-barrier multilayer film of the present invention comprises: the base member; and at least one or more thin film layers formed on at least one surface of the base member, wherein, in at least one layer of the thin film layer(s), an electron beam transmittance curve has at least one extremum, the electron beam transmittance curve representing the relationship between the distance from the surface of the layer in the film thickness direction of the layer and the electron beam transmittance.

Such a thin film layer is a layer formed on at least one side of the base member. In addition, in such a gas-barrier multilayer film (B), at least one layer of the thin film layer(s) needs to be such that the electron beam transmittance curve representing the relationship between the distance from the surface of the layer in the film thickness direction of the layer and the electron beam transmittance has at least one extremum. When the electron beam transmittance curve has at least one extremum as described above, the thin film layer makes it possible to achieve further sufficiently high gas barrier properties, and to sufficiently suppress the degradation in the gas barrier properties even when the film is bent. For such a thin film layer, the electron beam transmittance curve has more preferably at least two extrema, and particularly preferably at least three extrema because higher effects can be obtained. In addition, when the electron beam transmittance curve has at least three extrema as described above, the absolute value of the difference in distance from the surface of the thin film layer in the film thickness direction of the thin film layer between each of the extrema of the electron beam transmittance curve and any one of the extrema adjacent to the former one is preferably 200 nm or less, and more preferably 100 nm or less. Note that, in the present invention, an extremum refers to a local maximum or a local minimum of a curve (an electron beam transmittance curve) in which the magnitude of electron beam transmittance is plotted against the distance from the surface of the thin film layer in the film thickness direction of the thin film layer. In addition, in the present invention, whether the electron beam transmittance curve has an extremum (a local maximum or a local minimum) or not can be determined on the basis of a below-described method of determining whether an extremum exists or not.

In addition, in the present invention, the electron beam transmittance represents the degree of transmission of an electron beam through a material forming the thin film layer at a certain position in the thin film layer. As such a method for measuring the electron beam transmittance, various known methods can be employed; for example, there can be employed (i) a method for measuring electron beam transmittance by using a transmission electron microscope and (ii) a method for measuring electron beam transmittance by measuring secondary electrons or backscattered electrons by use of a scanning electron microscope. Hereinafter, the method for measuring electron beam transmittance and the method for measuring an electron beam transmittance curve will be described by taking a case of using a transmission electron microscope as an example.

In the method for measuring electron beam transmittance in a case of using such a transmission electron microscope, a sliced sample is first prepared by cutting a base member having a thin film layer in a direction perpendicular to the surface of the thin film layer. Next, a transmission electron microscope image of a surface of the sample (a surface perpendicular to the surface of the thin film layer) is obtained by using the transmission electron microscope. Then, by measuring the transmission electron microscope image in this way, the electron beam transmittance of the thin film at each position on the image can be determined on the basis of the contrast at the position. Here, when the sliced sample obtained by cutting the base member having the thin film layer in the direction perpendicular to the surface of the thin film layer is observed by using the transmission electron microscope, the contrast at each position of the transmission electron microscope image represents the change in electron beam transmittance of the material at the position. In order to make such a contrast correspond to electron beam transmittance, it is preferable to secure an appropriate contrast of the transmission electron microscope image, and it is preferable to appropriately select observation conditions such as the thickness of the sample (the thickness in the direction parallel to the surface of the thin film layer), the acceleration voltage, and the diameter of the objective aperture. The thickness of the sample is generally 10 to 300 nm, preferably 20 to 200 nm, more preferably 50 to 200 nm, and particularly preferably 100 nm. The acceleration voltage is generally 50 to 500 kV, preferably 100 to 300 kV, more preferably 150 to 250 kV, and particularly preferably 200 kV. The diameter of the objective aperture is preferably 5 to 800 µm, more preferably 10 to 200 µm, and particularly preferably 160 µm. In addition, as the transmission electron microscope, one capable of obtaining a transmission electron microscope image with a sufficiently high resolution is preferably used. The resolution is preferably at least 10 nm or less, more preferably 5 nm or less, and particularly preferably 3 nm or less.

In addition, in such a method for measuring electron beam transmittance, to determine the electron beam transmittance at each position of the thin film on the basis of the contrast at the position on the image, the transmission electron microscope image (gray-scale image) is divided into a repetition of constant unit regions, and each unit region is provided with a cross section gray-scale variable (C) corresponding to the degree of the gray-scale of the unit region. In general, such image processing can be easily conducted by electronic image processing using a computer. In such image processing, it is preferable to first cut out any region suitable for the analysis from the obtained gray-scale image. The thus cut-out gray-scale image needs to include at least a portion extending from one surface of thin film layer to the other surface opposite to the one surface. In addition, the thus cut-out gray-scale image may include a layer adjacent to the thin film layer. Examples of the layer adjacent to the thin film layer as described above include the base member and a protective layer necessary for carrying out the observation to obtain the gray-scale image. In addition, an end surface (a reference plane) of the thus cut-out gray-scale image needs to be in parallel with the surface of the thin film layer. In addition, the thus cut-out gray-scale image is preferably in a trapezoid or a parallelogram surrounded by at least two edges which are perpendicular to the direction perpendicular to the surface of the thin film layer (the film thickness direction) and which face to each other, and more preferably in a quadrilateral formed by such two edges and two edges perpendicular to the above-described two edges (in parallel with the film thickness direction).

The thus cut-out gray-scale image is divided into the repetition of uniform unit regions. As the dividing method, for example, a method of dividing the gray-scale image into a grid can be employed. In such a case, each of the unit regions divided into a grid constitutes one pixel. The pixels of the gray-scale image are preferably as fine as possible to reduce the error. However, there is a tendency that the finer the pixels are, the longer time the analysis requires. In this respect, the length of one edge of a pixel in such a gray-scale image is preferably 10 nm or less, more preferably 5 nm or less, and particularly preferably 3 nm or less, in terms of the actual length of the sample.

The thus provided cross section gray-scale variable (C) is a value obtained by converting the degree of gray scale of each region into numerical value information. Such a method for conversion into the cross section gray-scale variable (C) is not particularly limited. For example, such a setting (256-gradation setting) can be employed that the darkest unit region is set as 0, the lightest unit region is set as 255, and each unit region is provided with an integer between 0 to 255 depending on the degree of gray scale of the unit region. Note that, such numeric values are preferably determined such that a portion having a higher electron beam transmittance has a larger numeric value.

Then, a film thickness direction gray-scale variable ($C_z$) at the distance (z) from the reference plane in the film thickness direction of the thin film layer can be calculated from such cross section gray-scale variables (C) in the following method. Specifically, an average value of cross section gray-scale variables (C) of unit regions for which the distance (z) from the reference plane in the film thickness direction of the thin film layer is a predetermined value is calculated, so that the film thickness direction the gray-scale variable ($C_z$) is determined. Note that, the average value of the cross section gray-scale variables (C) described herein is preferably an average value of cross section gray-scale variables (C) of randomly selected 100 or more unit regions whose distances (z) from the reference plane are a predetermined value (the same value). In addition, when the film thickness direction gray-scale variable ($C_z$) is determined as described above, it is preferable to conduct, as appropriate, noise removal processing to remove noise. As the noise removal processing, a moving average method, an interpolation method, or the like may be employed. Examples of the moving average method include the simple moving average method, the weighted moving average method, the exponentially smoothed moving average method, and the like. It is more preferable to employ the simple moving average method. Meanwhile, when the simple moving average method is used, it is preferable to select, as appropriate, the range over which the average is to be obtained, in such a manner that the range can be sufficiently smaller than a typical size of a structure of the thin film layer in the film thickness direction thereof, and that the obtained data can be sufficiently smooth. Meanwhile, examples of the interpolation method include the spline interpolation method, the Lagrange interpolation method, the linear interpolation method, and the like. It is more preferable to employ the spline interpolation method, or the Lagrange interpolation method.

Through the noise removal operation, regions (these are referred to as transition regions) are formed near both interfaces of the thin film layer. In the transition regions, the film thickness direction gray-scale variable ($C_z$) changes gently with respect to the position in the film thickness direction. The transition regions are desirably excluded from regions used in the determination of an extremum in the electron beam transmittance curve of the thin film layer, from the viewpoint of clarifying the criteria in the determination whether or not the electron beam transmittance curve has an extremum to be described later. Note that, such transition regions are formed presumably because of the non-planarity of thin film interfaces, the above-described noise removal operation, and the like. For this reason, the transition regions can be excluded from the regions used in the determination of the electron beam transmittance curve by employing the following method. Specifically, first, a tentative interface position is set at a position of a distance (z) from the reference plane in the film thickness direction of the thin film layer, at which the absolute value of slope $|dC_z/dz|$ determined on the basis of the gray-scale image takes the maximum value near each of the interfaces of the thin film layer. Next, the absolute value of the slope ($dC_z/dz$) is sequentially checked from the outside to the inside of the tentative interface position (toward the thin film layer). A position of the distance (z) from the reference plane in the film thickness direction of the thin film layer at a position where such an absolute value reaches 0.1 $nm^{-1}$ (in the case of 256-gradation setting) is set as an interface of the thin film (the distance (z) being a position of a portion at which, in a case where a graph whose vertical axis represents the absolute value of $dC_z/dz$, and the horizontal axis represents the distance (z) from the reference plane is assumed, when the graph is examined in a direction from a distance (z) on the outside of the tentative interface position toward the inside (toward the thin film layer), the absolute value of $dC_z/dz$ first becomes lower than 0.1 $nm^{-1}$). Then, regions outside the interfaces are excluded from the regions used in the determination of the electron beam transmittance curve of the thin film layer. Thus, the transition regions can be excluded from the determination regions. In addition, when the film thickness direction gray-scale variable ($C_z$) is found in this way, the average value of the film thickness direction gray-scale variable ($C_z$) in the range corresponding to the thin film layer is preferably normalized to be 1.

The thus calculated film thickness direction gray-scale variable ($C_z$) is in a proportional relationship with the electron beam transmittance (T). For this reason, the electron beam transmittance curve can be created by representing the film thickness direction gray-scale variable ($C_z$) with respect to the distance (z) from the reference plane in the film thickness direction of the thin film layer. Specifically, the electron beam transmittance curve can be determined by plotting the film thickness direction gray-scale variable ($C_z$) with respect to the distance (z) from the reference plane in the film thickness direction of the thin film layer. Moreover, the change in the slope ($dT/dz$) of the electron beam transmittance (T) can also be known by calculating the slope ($dC_z/dz$) which is obtainable by differentiating the film thickness direction gray-scale variable ($C_z$) with respect to the distance (z) from the reference plane in the film thickness direction of the thin film layer.

Moreover, whether or not the thus determined electron beam transmittance curve has an extremum can be determined as follows. Specifically, when the electron beam transmittance curve has an extremum (a local maximum or a local minimum), the maximum value of the slope ($dC_z/dz$) of the gray scale coefficient in the film thickness direction takes a positive value, and the minimum value thereof takes a negative value. Consequently, the absolute value of the difference therebetween is large. In contrast, when no extremum exists, the maximum value and the minimum value of the slope ($dC_z/dz$) both take positive or negative values. Consequently, the absolute value of the difference therebetween is small. For this reason, in determining whether or not an extremum exist, it is possible to determine whether or not an extremum exists by determining whether or not the maximum value and the minimum value of the slope ($dC_z/dz$) both take positive values or negative values, and it is also possible to determine whether or not the electron beam transmittance curve has an extremum on the basis of the magnitude of the absolute value of the difference between the maximum value $(dC_z/dz)_{Max}$ and the minimum value $(dC_z/dz)_{MIN}$ of the slope ($dC_z/dz$). Note that, when no extremum exists, the film thickness direction gray-scale variable ($C_z$) always should be a normalized average value, i.e., 1. However, since signals actually contain slight noises, the electron beam transmittance curve fluctuates due to the noise around a value close to the normalized average value, i.e., 1. For this reason, in determining whether or not the electron beam transmittance curve has an extremum, if whether or not an extremum exists is determined on the basis of only the viewpoint of whether or not the maximum value and the minimum value of the slope of the electron beam transmittance curve are positive or negative values, or the viewpoint of the absolute value of the difference between the maximum value and the minimum value of the slope of the electron beam transmittance curve, the noises may lead to a determination that the electron beam transmittance curve has an extremum in some cases. In this respect, in the determination whether or not an extremum exists, an extremum is distinguished from a fluctuation due to noise on the basis of the following criteria. Specifically, suppose a case where a point at which the sign of the slope ($dC_z/dz$) of the film thickness direction gray-scale variable ($C_z$) is reversed after passing through zero is set as a tentative extremum point. In this case, if the absolute value of the difference between the film thickness direction gray-scale variable ($C_z$) at the tentative extremum point and the film thickness direction gray-scale variable ($C_z$) at another adjacent tentative extremum point (in the cases where two adjacent tentative extremum points exist, the point which gives a greater absolute value of the difference is selected) is 0.03 or greater, the tentative extremum point can be determined to be a point with an extremum. In other words, the absolute value of the difference between the film thickness direction gray-scale variable ($C_z$) at the tentative extremum point and the film thickness direction gray-scale variable ($C_z$) at the adjacent tentative extremum point (in the cases where two adjacent tentative extremum points exist, the point which gives a greater absolute value of the difference is selected) is less than 0.03, the tentative extremum point can be determined to be noise. Note that, when only one tentative extremum point exists, it is possible to employ a method in which if the absolute value of the difference between the film thickness direction gray-scale variable ($C_z$) and the normalized average value, i.e., 1 is 0.03 or greater, the tentative extremum point is determined not to be noise but to be an extremum. Here, such an numeric value as "0.03" is a numeric value obtained when the magnitude of the numeric value of the film thickness direction ray-scale variable ($C_z$) is normalized, where the average value of the film thickness direction gray-scale variable ($C_z$) determined in the above-described 256-gradation setting is set as 1, (note that the numeric value "0" of the film thickness direction gray-scale variable determined in the 256-gradation setting is directly set as "0" in the normalization).

Moreover, the gas-barrier multilayer film of the present invention is one in which the electron beam transmittance curve of at least one thin film layer has at least one extremum. Such a thin film layer whose electron beam transmittance curve has at least one extremum can be said to be a layer in which the composition changes in the film thickness direction. In addition, the gas-barrier multilayer film comprising such a thin film layer makes it possible to achieve sufficiently high gas barrier properties and to sufficiently suppress the degradation in gas barrier properties even when the film is bent. Moreover, the electron beam transmittance curve is preferably substantially continuous. In this DESCRIPTION, the phrase "the electron beam transmittance curve is substantially continuous" means that the electron beam transmittance curve does not have any portion in which the electron beam transmittance changes discontinuously. Specifically, this means that the absolute value of the slope ($dC_z/dz$) of the film thickness direction gray-scale variable ($C_z$) is not greater than a predetermined value, and preferably not greater than $5.0 \times 10^{-2}$/nm.

Moreover, in the present invention, the thin film layer in the gas-barrier multilayer film (B) is preferably substantially uniform in the film surface direction (a direction parallel to the surface of the thin film layer) from the viewpoint of forming a thin film layer having uniform and excellent gas barrier properties over the entire film surface. In such a gas-barrier multilayer film (B), the phrase "the thin film layer is substantially uniform in the film surface direction" means that when an electron beam transmittance curve is obtained by measuring the electron beam transmittance at any point on the film surface of the thin film layer, the numbers of extrema that the obtained electron beam transmittance curves have are the same. Note that in a case where the samples for measurement are cut out from at any two points on the film surface of the thin film layer, and the electron beam transmittance curve is produced for each of the samples. In such a case, if the numbers of extrema that the electron beam transmittance curves of all the samples have are the same, the thin film layer can be deemed substantially uniform.

The thin film layer according to the present invention can be formed by appropriately using any known material that is known to have gas barrier properties. Examples of such a material of the thin film layer include metals such as aluminum, silver, chromium, and titanium; oxides such as silicon oxide, aluminum oxide, titanium oxide, and silicon oxynitride; nitrides such as silicon nitride; sulfides; fluorides; and carbides. These materials may be used alone or two or more of them may be used in combination.

In addition, the gas-barrier multilayer film of the present invention needs to comprise at least one thin film layer as described above, but may have two or more such layers. Moreover, when the gas-barrier multilayer film comprises two or more such thin film layers, the materials of the multiple thin film layers may be the same or different. Moreover, when the gas-barrier multilayer film comprises two or more such thin film layers, the thin film layers may be formed on one surface of the base member, or on both surfaces of the base member. Moreover, the multiple thin film layers may include thin film layers which do not necessarily have gas barrier properties.

Among these materials of the thin film layers, it is preferable to use silicon oxide as a main component, it is more preferable to mainly use a silicon oxide represented by the general formula: $SiO_X$ (in the general formula, X represents a number of 1 to 2), and it is particularly preferable to use a silicon oxide represented by the general formula: $SiO_X$ (in the general formula, X represents a number of 1.5 to 2.0) as a main component, from the viewpoint of the balance between the transparency and the gas barrier properties of the obtained gas-barrier multilayer film. Note that, in this DESCRIPTION, the phrase "used as a main component" means that the content of the component is 50% by mass or more (preferably 70% by mass or more) with respect to the total mass of components in the material.

In addition, each thin film layer containing such a silicon oxide as a main component may further contain elements other than silicon and than oxygen. One example of such an element is carbon. For a thin film layer containing silicon, oxygen, and carbon, it is preferable to use a silicon-oxygen-carbon compound represented by the general formula: $SiO_XC_Y$ (in the general formula, X represents a number of 0 to 2, and Y represents a number of 0 to 2) as the main component. Moreover, these thin film layers may contain hydrogen as an element other than silicon, oxygen, and carbon.

For a thin film layer containing silicon, oxygen, carbon, and hydrogen, it is preferable to use a silicon-oxygen-carbon-hydrogen compound represented by the general formula: $SiO_XC_YH_Z$ (in the general formula, X represents a number of 0 to 2, Y represents a number of 0 to 2, and Z represents a number of 0 to 6) as the main component.

Moreover, these thin film layers may contain elements other than silicon, oxygen, carbon, and hydrogen. One example of such an element is nitrogen, and other examples thereof include boron, aluminum, phosphorus, sulfur, fluorine, and chlorine.

When the material of the thin film layer is the silicon oxide, the ratio X of oxygen to silicon in the general formula may be constant in the thin film layer. Alternatively, the ratio X may vary in the film thickness direction of the thin film layer.

When the material of the thin film layer is the silicon-oxygen-carbon compound, the ratio X of oxygen to silicon and the ratio Y of carbon to silicon in the general formula may be constant in the thin film layer. Alternatively, the ratio X and the ratio Y may vary in the film thickness direction of the thin film layer.

When the material of the thin film layer is the silicon-oxygen-carbon-hydrogen compound, the ratio X of oxygen to silicon, the ratio Y of carbon to silicon, and the ratio Z of hydrogen to silicon in the general formula may be constant in the thin film layer. Alternatively, the ratio X, the ratio Y, and the ratio Z may vary in the film thickness direction of the thin film layer.

The film structures of such thin film layers can be determined by analyzing the thin film layers in the following method. Specifically, in the method, the analysis is conducted by using, for example, a surface analyzer such as an X-ray photoelectron spectrometer (XPS: Xray Photoelectron Spectroscopy), or a secondary ion mass spectrometer (SIMS: Secondary Ion Mass Spectroscopy), while ion etching is being conducted in the film thickness direction of the thin film layer.

Hereinabove, the gas-barrier multilayer films (A) and (B) suitable as the gas-barrier multilayer film of the present invention are described. However, the gas-barrier multilayer film of the present invention only needs to be one in which at least one layer of the thin film layer(s) satisfies at least one of the above-described requirements (A) and (B).

In addition, in the gas-barrier multilayer film of the present invention, the thickness of each thin film layer satisfying at least one of the above-described requirements (A) and (B) is preferably in a range from 5 to 3000 nm, more preferably in a range from 10 to 2000 nm, and particularly preferably in a range from 100 to 1000 nm. If the thickness of the thin film layer is less than the lower limit, gas barrier properties such as oxygen gas barrier properties, water vapor barrier properties, and the like tend to be poor. Meanwhile, if the thickness exceeds the upper limit, the gas barrier properties tend to degrade due to bending.

Moreover, when the gas-barrier multilayer film of the present invention has multiple thin film layers, the total value of the thicknesses of the thin film layers is in a range from generally 10 to 10000 nm, preferably in a range from 10 to 5000 nm, more preferably in a range from 100 to 3000 nm, and particularly preferably in a range from 200 to 2000 nm. If the total value of the thickness of the thin film layer is less than the lower limit, gas barrier properties such as oxygen gas barrier properties, water vapor barrier properties, and the like tend to be poor. Meanwhile, if the total value of the thickness exceeds the upper limit, the gas barrier properties tend to degrade due to bending.

The gas-barrier multilayer film of the present invention comprises the base member and the thin film layer satisfying at least one of the above-described requirements (A) and (B). In addition, the gas-barrier multilayer film of the present invention may further comprise a primer coat layer, a heat seal resin layer, an adhesive layer, and the like, if necessary. Such a primer coat layer can be formed by using a known primer coating agent capable of improving the adhesion between the base member and the thin film layer. Moreover, such a heat seal resin layer can be formed by using a known heat seal resin as appropriate. Moreover, such an adhesive layer can be formed by using a known adhesive as appropriate. Further, multiple gas-barrier multilayer films may be bonded to each other by such an adhesive layer.

In addition, in the gas-barrier multilayer film of the present invention, the thin film layer satisfying at least one of the above-described requirements (A) and (B) is preferably a layer formed by a plasma enhanced chemical vapor deposition method. Such a thin film layer formed by the plasma enhanced chemical vapor deposition method is more preferably a layer formed by a plasma enhanced chemical vapor deposition method in which the base member is placed on the pair of film forming rolls and plasma is generated by performing discharge between the pair of film forming rolls. In addition, during the discharge between the pair of film forming rolls as described above, the polarities of the pair of film forming rolls are preferably reversed alternately. Moreover, as a film-forming gas used for the plasma enhanced chemical vapor deposition method, a gas containing an organosilicon compound and oxygen is preferable. The content of oxygen in the film-forming gas is preferably not more than a theoretical amount of oxygen necessary to completely oxidize the entire amount of the organosilicon compound in the film-forming gas. In addition, in the gas-barrier multilayer film of the present invention, the thin film layer is preferably a layer formed by a continuous film formation process. Note that the method for forming a thin film layer utilizing such a plasma enhanced chemical vapor deposition method will be described in a method for producing the gas-barrier multilayer film of the present invention to be described later.

Method for Producing Gas-Barrier Multilayer Film of the Present Invention

Next, the method for producing a gas-barrier multilayer film of the present invention will be described. The gas-barrier multilayer film of the present invention can be produced by forming the thin film layer on a surface of the base member. As the method for forming the thin film layer according to the present invention on a surface of the base member, a plasma enhanced chemical vapor deposition method (plasma enhanced CVD) is preferably employed from the viewpoint of gas barrier properties. Note that, the plasma enhanced chemical vapor deposition method may be a plasma enhanced chemical vapor deposition method of the penning discharge plasma system.

In addition, when plasma is generated by the plasma enhanced chemical vapor deposition method, the plasma discharge is preferably generated in a space between the multiple film forming rolls. More preferably, a pair of film forming rolls are used, the base member is placed on each of the pair of film forming rolls, and the plasma is generated by performing discharge between the pair of film forming rolls. By using the pair of film forming rolls, placing the base member on the pair of film forming rolls, and performing the discharge between the pair of film forming rolls as described above, the thin film can be produced efficiently because, during the film formation, the film formation can be conducted on a portion of the surface of the base member present on one of the film forming rolls, while the film formation can be conducted simultaneously on a portion of the surface of the base member present on the other one of the film forming rolls. Moreover, since the film formation rate can be doubled, and since films of the same structure can be formed, the number of the extrema of the electron beam transmittance curve and the carbon distribution curve can be increased at least twice. As a result, it is made possible to efficiently form a thin film layer satisfying the above-described requirements (A) and/or (B) (a layer satisfying all the above-described requirements (i) to (iii) and/or a layer whose electron beam transmittance curve has at least one extremum). Moreover, in the gas-barrier multilayer film of the present invention, the thin film layer is preferably formed on the surface of the base member by the roll-to-roll method from the viewpoint of the productivity. Moreover, an apparatus which can be used in producing the gas-barrier multilayer film by such a plasma enhanced chemical vapor deposition method is not particularly limited. A preferable apparatus is one comprising at least one pair of film forming rolls and a plasma power source, and being configured to discharge between the pair of film forming rolls. For example, the use of the manufacturing apparatus shown in FIG. 1 enables the production by the roll-to-roll method while using the plasma enhanced chemical vapor deposition method.

Hereinafter, the method for producing the gas-barrier multilayer film of the present invention will be described more specifically with reference to FIG. 1. Note that FIG. 1 is a schematic diagram showing one example of the manufacturing apparatus which can be used suitably in producing the gas-barrier multilayer film of the present invention. In addition, in the following description and drawings, the same or equivalent elements are denoted by the same reference numerals, and overlapping description thereof is omitted.

The manufacturing apparatus shown in FIG. 1 comprises a feed roll 11, transfer rolls 21, 22, 23, and 24, film forming rolls 31 and 32, a gas supply pipe 41, plasma generation power source 51, magnetic field generation apparatuses 61 and 62 disposed inside the film forming rolls 31 and 32, respectively, and a winding roll 71. In addition, in such a manufacturing apparatus, at least the film forming rolls 31 and 32, the gas supply pipe 41, the plasma generation power source 51, the magnetic field generation apparatuses 61 and 62 are placed in an unillustrated vacuum chamber. Moreover, in such a manufacturing apparatus, the vacuum chamber is connected to an unillustrated vacuum pump, and the vacuum pump enables the pressure in the vacuum chamber to be adjusted as appropriate.

In such a manufacturing apparatus, each of the pair of film forming rolls are connected to the plasma generation power source 51 so that the pair of film forming rolls (the film forming roll 31 and the film forming roll 32) is capable of functioning as a pair of counter electrodes. For this reason, in such a manufacturing apparatus, discharge can be performed in a space between the film forming roll 31 and the film forming roll 32 by supplying an electrical power from the plasma generation power source 51. This makes it possible to generate plasma in the space between the film forming roll 31 and the film forming roll 32. Note that, when the film forming roll 31 and the film forming roll 32 are used also as the electrodes as described above, the materials and designs thereof may be changed as appropriate, so that the film forming roll 31 and the film forming roll 32 can be used as the electrodes. In addition, in such a manufacturing apparatus, the pair of film forming rolls (the film forming rolls 31 and 32) are preferably placed so that the center axes thereof can be substantially parallel on a single plane. By placing the pair of film forming rolls (the film forming rolls 31 and 32) as described above, the film formation rate can be doubled, and films of the same structures can be formed. Hence, the extrema of the electron beam transmittance curve and the carbon distribution curve can be increased at least twice. Moreover, such a manufacturing apparatus makes it possible to form a thin film layer on a surface of the film 100 by the CVD method. Moreover, while film components are deposited on the surface of the film 100 on the film forming roll 31, film components can be deposited also on the surface of the film 100 on the film forming roll 32. Hence, the thin film layer can be efficiently formed on the surface of the film 100.

Moreover, the magnetic field generation apparatuses 61 and 62, which are fixed so as not to be rotated even when the film forming rolls rotate, are provided inside the film forming roll 31 and the film forming roll 32, respectively.

Moreover, any known rolls can be used, as appropriate, as the film forming roll 31 and the film forming roll 32. Those having the same diameter are preferably used as the film forming rolls 31 and 32, from the viewpoint of forming the thin film more efficiently. In addition, the diameters of such film forming rolls 31 and 32 are preferably in a range from 5 to 100 cm, from the viewpoints of discharge conditions, the space of the chamber, and the like.

Moreover, in such a manufacturing apparatus, the film 100 is placed on the pair of the film forming rolls (the film forming roll 31 and the film forming roll 32) so that the surfaces of the film 100 on the film forming rolls can face each other. The placement of the film 100 in this way enables simultaneous film formation on each of the surfaces of the film 100 present between the pair of the film forming rolls when plasma is generated by performing the discharge between the film forming roll 31 and the film forming roll 32. In other words, such a manufacturing apparatus makes it possible to conduct a CVD method in which film components are deposited on the surface of the film 100 on the film forming roll 31, while film components are moreover deposited on the surface of the film 100 on the film forming roll 32. Hence, the thin film layer can efficiently be formed on the surface of the film 100.

In addition, any known rolls can be used, as appropriate, as the feed roll 11 and the transfer rolls 21, 22, 23, and 24 used in such a manufacturing apparatus. Moreover, the winding roll 71 only needs to be capable of winding the film 100 having the thin film layer formed therein, and is not particularly limited. Any known roll can be used, as appropriate, as the winding roll 71.

In addition, any pipe capable of supplying or exhausting the raw material gas and the like at a predetermined rate can be used, as appropriate, as the gas supply pipe 41. Moreover, any known power source for a plasma generation apparatus can be used, as appropriate, as the plasma generation power source 51. Such a plasma generation power source 51 makes it possible to use the film forming roll 31 and the film forming roll 32 as the counter electrode for discharge by supplying electrical power to the film forming roll 31 and the film forming roll 32 connected to the plasma generation power source 51. As such a plasma generation power source 51, a power source (alternating-current power source or the like) is preferably used which is capable of alternately reversing the polarities of the pair of film forming rolls, because the plasma enhanced CVD can be conducted more efficiently. In addition, as such a plasma generation power source 51, a power source is more preferable which is capable of setting an applied electrical power at 100 W to 10 kW, and also capable of setting the alternating-current frequency at 50 Hz to 500 kHz, because the plasma enhanced CVD can be conducted more efficiently. In addition, any known magnetic field generation apparatuses can be used, as appropriate, as the magnetic field generation apparatuses 61 and 62. Moreover, besides the base member used in the present invention, a film in which the thin film layer is formed in advance can be used as the film 100. When such a film in which the thin film layer is formed in advance is used as the film 100 as described above, it is also possible to increase the thickness of the aforementioned thin film layer.

The gas-barrier multilayer film of the present invention can efficiently be produced by using such a manufacturing apparatus as shown in FIG. 1, and by appropriately adjusting, for example, the kind of the raw material gas, the electrical power of the electrode drums of the plasma generation apparatus, the pressure in the vacuum chamber, the diameters of the film forming rolls, and the film transfer rate. Specifically, by using the manufacturing apparatus shown in FIG. 1, the film-forming gas (the raw material gas and the like) is supplied into the vacuum chamber, and the discharge is generated between the pair of the film forming rolls (the film forming rolls 31 and 32). Thus, the film-forming gas (the raw material gas and the like) is decomposed by the plasma, and the thin film layer is formed by the plasma enhanced CVD on the surface of the film 100 on the film forming roll 31 and the surface of the film 100 on the film forming roll 32. Note that, in such a film formation, the film 100 is transferred by the feed roll 11, the film forming roll 31, and the like, so that the thin film layer is formed on the surface of the film 100 by a continuous film formation process of the roll-to-roll method.

As the raw material gas in the film-forming gas used in such formation of the thin film layer, any raw material gas can be selected and used as appropriate in accordance with the material of the thin film layer to be used. An organosilicon compound containing silicon can be used as the raw material gas, for example, in a case where the material of the thin film layer is a material containing silicon, such as silicon oxide. Examples of such an organosilicon compound include hexamethyldisiloxane, 1.1.3.3-tetramethyldisiloxane, vinyltrimethylsilane, methyltrimethylsilane, hexamethyldisilane, methylsilane, dimethylsilane, trimethylsilane, diethylsilane, propylsilane, phenylsilane, vinyltriethoxysilane, vinyltrimethoxysilane, tetramethoxysilane, tetraethoxysilane, phenyltrimethoxysilane, methyltriethoxysilane, and octamethylcyclotetrasiloxane. Of these organosilicon compounds, hexamethyldisiloxane and 1.1.3.3-tetramethyldisiloxane are preferable from the viewpoints of the ease of handling of the compound, and characteristics such as gas barrier properties of the obtained thin film layer. These organosilicon compounds can be used alone or in combination of two or more kinds.

In addition to the raw material gas, a reaction gas may be used for the film-forming gas in a case where the material of the thin film layer is an inorganic compound such as an oxide, a nitride, or a sulfide. As the reaction gas, a gas which is to be converted into an inorganic compound such as an oxide or a nitride upon reaction with the raw material gas can be selected and used as appropriate. For example, oxygen or ozone can be used as a reaction gas for forming an oxide. Meanwhile, for example, nitrogen or ammonia can be used as a reaction gas for forming a nitride. These reaction gases can be used alone or in combination of two or more kinds. For example, when an oxynitride is formed, a reaction gas for forming an oxide and a reaction gas for forming a nitride can be used in combination.

For the film-forming gas, a carrier gas may be used to supply the raw material gas into the vacuum chamber, if necessary. Moreover, for the film-forming gas, an electrical discharge gas may be used to cause plasma discharge, if necessary. As the carrier gas or the electrical discharge gas, any known gas can be used as appropriate. For example, a noble gas such as helium, argon, neon, or xenon; or hydrogen can be used.

Regarding the ratio between the raw material gas and the reaction gas in a case where the film-forming gas contains the raw material gas and the reaction gas, it is preferable not to make the ratio of the reaction gas too excessive with respect to an amount ratio of the reaction gas theoretically necessary for the raw material gas and the reaction gas to completely react with each other. If the ratio of the reaction gas is too excessive, the reaction proceeds excessively, so that a uniform film of a completely reacted product is formed. As a result, no variation in composition is found in the thin film layer, no extremum is found in the electron beam transmittance curve, or a thin film satisfying all the above-described requirements (i) to (iii) cannot be obtained. In such a case, excellent barrier properties and anti-bending properties cannot be obtained by the formed thin film layer. In addition, when the film-forming gas contains the organosilicon compound and oxygen, the amount of oxygen is preferably not more than the theoretical amount of oxygen necessary to completely oxidize the entire amount of the organosilicon compound in the film-forming gas.

Hereinafter, a preferred ratio between the raw material gas and the reaction gas in the film-forming gas and the like will be described more specifically, while a case where a silicon-oxygen-based thin film is produced by using, as the film-forming gas, a gas containing hexamethyldisiloxane (an organosilicon compound: HMDSO: $(CH_3)_6Si_2O$:) as the raw material gas and oxygen ($O_2$) as the reaction gas is taken as an example.

When the film-forming gas containing hexamethyldisiloxane (HMDSO, $(CH_3)_6Si_2O$) as the raw material gas and oxygen ($O_2$) as the reaction gas is allowed to react by plasma enhanced CVD to form a silicon-oxygen-based thin film, the film-forming gas undergoes a reaction as shown in the following reaction formula (1):

$$(CH_3)_6Si_2O + 12O_2 \rightarrow 6CO_2 + 9H_2O + 2SiO_2 \qquad (1)$$

to produce silicon dioxide. In such a reaction, the amount of oxygen necessary to completely oxidize one mole of hexamethyldisiloxane is 12 moles. For this reason, when a film-forming gas containing 12 moles or more of oxygen per mole of hexamethyldisiloxane is allowed to completely react, a uniform silicon dioxide film is formed. Hence, it becomes impossible to form the thin film layer satisfying the above-described requirements (A) and/or (B) (the thin film layer satisfying all the above-described requirements (i) to (iii) and/or the thin film layer whose electron beam transmittance curve has at least one extremum). For this reason, in the present invention, the amount of oxygen needs to be fewer than 12 moles, which is the stoichiometric ratio, per mole of hexamethyldisiloxane in forming the thin film layer, so that the reaction of the above-described formula (1) will not proceed completely. Note that, in an actual reaction in a plasma enhanced CVD chamber, the raw material, hexamethyldisiloxane, and the reaction gas, oxygen, are supplied from the gas supplying portion to the film formation region where the film is formed. Hence, even when the molar amount (flow rate) of the reaction gas, oxygen, is 12 times the molar amount (flow rate) of the raw material, hexamethyldisiloxane, the reaction actually cannot proceed completely. Presumably, the reaction is completed only when the content of oxygen supplied is in a large excess with respect to the stoichiometric ratio (for example, in some cases, the molar amount (flow rate) of oxygen is set about 20 times or more the molar amount (flow rate) of the raw material, hexamethyldisiloxane in order to obtain silicon oxide by complete oxidation in CVD). For this reason, the molar amount (flow rate) of oxygen with respect to the molar amount (flow rate) of the raw material, hexamethyldisiloxane, is preferably not more than 12 times amount, which is the stoichiometric ratio (more preferably, not more than 10 times amount). When hexamethyldisiloxane and oxygen are contained at such a ratio, carbon atoms and hydrogen atoms in hexamethyldisiloxane which have not been completely oxidized are incorporated into the thin film layer. Hence, a layer in which the composition varies in the film thickness direction can be formed, and it becomes possible to form the thin film layer satisfying the above-described requirements (A) and/or (B) (the thin film layer satisfying all the above-described requirements (i) to (iii) and/or the thin film layer whose electron beam transmittance curve has at least one extremum, or the like). As a result, it becomes possible to cause the obtained gas-barrier multilayer film to exhibit excellent barrier properties and anti-bending properties. Note that, when the molar amount (flow rate) of oxygen in the film-forming gas is too small with respect to the molar amount (flow rate) of hexamethyldisiloxane in the film-forming gas, carbon atoms and hydrogen atoms which have not been oxidized are incorporated into the thin film layer excessively. In such a case, the transparency of the barrier film decreases, and the barrier film cannot be used for flexible substrates of devices requiring transparency, such as organic EL devices and organic thin film solar cells. From such a viewpoint, the lower limit of the molar amount (flow rate) of oxygen with respect to the molar amount (flow rate) of hexamethyldisiloxane in the film-forming gas is preferably an amount greater than 0.1 times the molar amount (flow rate) of hexamethyldisiloxane, and more preferably an amount greater than 0.5 times the molar amount (flow rate) of hexamethyldisiloxane.

In addition, the pressure (the degree of vacuum) in the vacuum chamber can be adjusted as appropriate in accordance with the kind of the raw material gas and the like. The pressure is preferably in a range from 0.5 Pa to 50 Pa.

Moreover, to perform the discharge between the film forming rolls 31 and 32 in such a plasma enhanced CVD method, the electrical power applied to the electrode drums (disposed on the film forming rolls 31 and 32 in this embodiment) connected to the plasma generation power source 51 can be adjusted as appropriate in accordance with the kind of the raw material gas, the pressure in the vacuum chamber, and the like, and can not be generalized. However, the electrical power applied is set preferably in a range from 0.1 to 10 kW. If the electrical power applied is less than the lower limit, particles tend to be easily formed. Meanwhile, if the electrical power applied exceeds the upper limit, the heat generated during the film formation is increased, so that the temperature of the surface of the base member is elevated during the film formation. As a result, the base member may be damaged by the heat, so that wrinkles are formed during the film formation, or, in a worse case, the film may melt due to the heat, so that a discharge with a large current may occur between uncovered film forming rolls to damage the film forming rolls themselves.

The transfer rate (line speed) of the film 100 can be adjusted as appropriate in accordance with the kind of the raw material gas, the pressure in the vacuum chamber, and the like. The transfer rate is preferably in a range from 0.25 to 100 m/min, and more preferably in a range from 0.5 to 20 m/min. If the line speed is less than the lower limit, wrinkles tend to be easily formed in the film due to heat. Meanwhile, if the line speed exceeds the upper limit, the thickness of the formed thin film layer tends to be thin.

EXAMPLES

Hereinafter, the present invention will be described more specifically on the basis of Examples and Comparative Examples. However, the present invention is not limited to Examples below. Note that the water vapor permeability and the water vapor permeability after the bending test of gas-barrier multilayer films were measured by the following method.

(i) Measurement of Water Vapor Permeability

The water vapor permeability of gas-barrier multilayer films was measured by using a water vapor permeability analyzer (manufactured by GTR Tec Corporation, model name "GTRTec-30XASC") under conditions of a temperature of 40° C., a humidity on a lower humidity side of 0% RH, and a humidity on a higher humidity side of 90% RH. In addition, the water vapor permeability of gas-barrier multi layer films was measured by using a water vapor permeability analyzer (manufactured by Lyssy, model name "Lyssy-L80-5000") under conditions of a temperature of 40° C., a humidity on a lower humidity side of 10% RH, and a humidity on a higher humidity side of 100% RH.

(ii) Measurement of Water Vapor Permeability After Bending-Test

A bending test was conducted in which each gas-barrier multilayer film was wound around a metal rod, and left in the state for one minute. Thereafter, the gas-barrier multilayer film was returned to the flat state, and used as a sample. Note that the radius of curvature R in the bending test was equivalent to ½ of the diameter of the rod, but when the number of the times of winding of the gas-barrier multilayer film was large, ½ of the diameter of the rod with the film wound therearound was employed as the radius of curvature R. Next, the water vapor permeability of the sample was measured by using a water vapor permeability analyzer (manufactured by Lyssy, model name "Lyssy-L80-5000") under conditions of a temperature of 40° C., a humidity on a lower humidity side of 10% RH, and a humidity on a higher humidity side of 100% RH.

Example 1

A gas-barrier multilayer film was produced by using the manufacturing apparatus shown in the above-described FIG. 1. Specifically, a biaxially-oriented polyethylene naphthalate film (PEN film, thickness: 100 μm, width: 350 mm, manufactured by Teijin DuPont Films Japan Limited, trade name "Teonex Q65FA") was used as a base member (the film 100). This film was mounted onto the feed roll 11. Then, a magnetic field was applied between the film forming roll 31 and the film forming roll 32, and electrical power was supplied to each of the film forming roll 31 and the film forming roll 32, so that plasma was generated by performing discharge between the film forming roll 31 and the film forming roll 32. A film-forming gas (a mixture gas containing hexamethyldisiloxane (HMDSO) as a raw material and oxygen gas as a reaction gas (also functioning as an electrical discharge gas) was supplied to such a discharge region, so that a thin film was formed by a plasma enhanced CVD method under the following conditions. Thus, the gas-barrier multilayer film was obtained.

<Film Formation Conditions>

Amount of raw material gas supplied: 50 sccm (Standard Cubic Centimeter per Minute)
Amount of oxygen gas supplied: 500 sccm
Mixing ratio of film-forming gas (hexamethyldisiloxane/oxygen): 50/500 [Unit: sccm]
Degree of vacuum in vacuum chamber: 3 Pa
Electrical power applied by a plasma generation power source: 0.8 kW
Frequency of plasma generation power source: 70 kHz
Transfer rate of film: 0.5 m/min.

The thickness of the thin film layer in the thus obtained gas-barrier multilayer film was 0.3 μm. In addition, the water vapor permeability of the obtained gas-barrier multilayer film was $3.1 \times 10^{-4}$ g/(m²·day) under the conditions of a temperature of 40° C., a humidity on a lower humidity side of 0% RH, and a humidity on a higher humidity side of 90% RH. The value of the water vapor permeability thereof was not greater than the detection limit, under the conditions of a temperature of 40° C., a humidity on a lower humidity side of 10% RH, and a humidity on a higher humidity side of 100% RH. Moreover, after the obtained gas-barrier multilayer film was bent under a condition of a radius of curvature of 8 mm, the value of the water vapor permeability thereof was not greater than the detection limit, under the conditions of a temperature of 40° C., a humidity on a lower humidity side of 10% RH, and a humidity on a higher humidity side of 100% RH. It was found that, even when the obtained gas-barrier multilayer film was bent, it was possible to sufficiently suppress the degradation in gas barrier properties.

<Silicon Distribution Curve, Oxygen Distribution Curve, Carbon Distribution Curve, and Oxygen-Carbon Distribution Curve>

The obtained gas-barrier multilayer film was subjected to XPS depth profile measurement under the following conditions to create a silicon distribution curve, an oxygen distribution curve, a carbon distribution curve, and an oxygen-carbon distribution curve.

Figure 2:
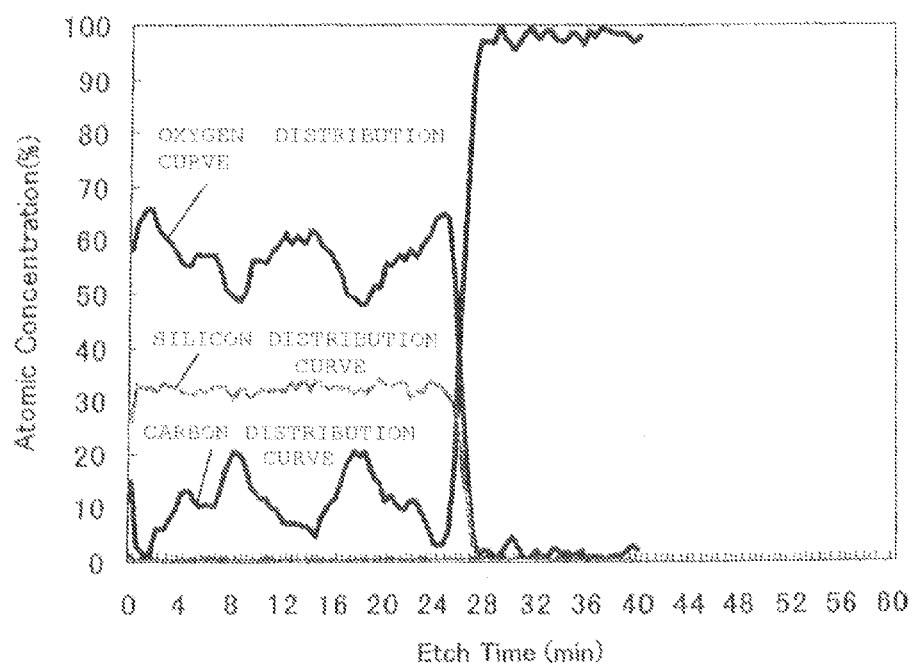
FIG. 2 is a graph showing the silicon distribution curve, the oxygen distribution curve, and the carbon distribution curve of the gas-barrier multilayer film obtained in Example 1.
Figure 3:
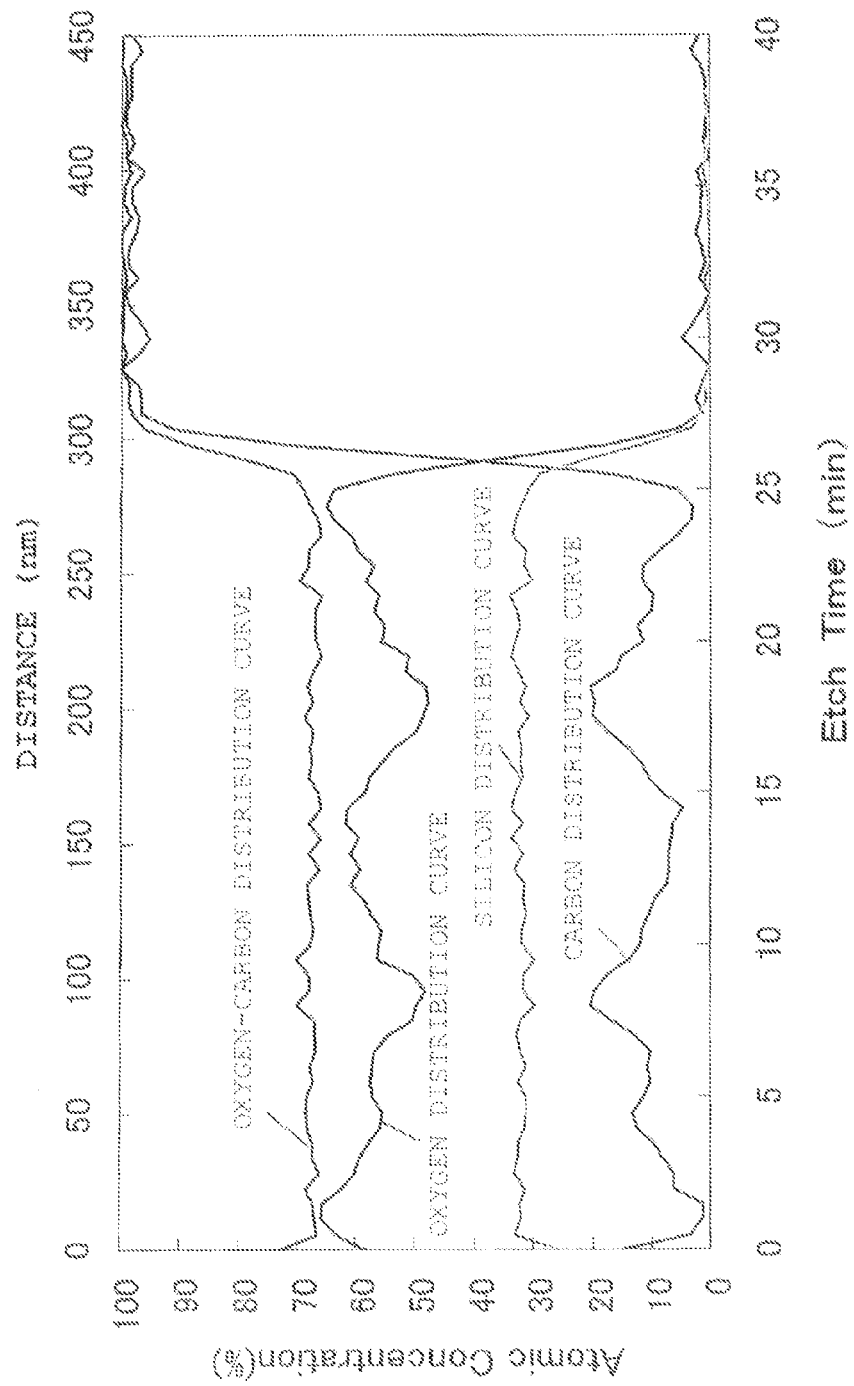
FIG. 3 is a graph showing the silicon distribution curve, the oxygen distribution curve, the carbon distribution curve, and the oxygen-carbon distribution curve of the gas-barrier multilayer film obtained in Example 1.

Ion species for etching: argon (Ar+)
Etching rate (value in terms of $SiO_2$ thermal oxide film): 0.05 nm/sec
Etching intervals (value in terms of $SiO_2$): 10 nm
X-ray photoelectron spectrometer: model name "VG Theta Probe" manufactured by Thermo Fisher Scientific K.K.
Applied X-rays: single crystal spectrum AlKα
Spot and size of X-rays: elliptical shape of 800×400 μm FIG. 2 shows the obtained silicon distribution curve, oxygen distribution curve, and carbon distribution curve. FIG. 3 shows a graph illustrating the relationship between each atomic ratio and etching time and also the relationship between each atomic ratio and the distance (nm) from the surface of the thin film layer in the obtained silicon distribution curve, oxygen distribution curve, carbon distribution curve, and oxygen-carbon distribution curve. Note that the "distance (nm)" shown on the horizontal axis of the graph shown in FIG. 3 is a value obtained through calculation based on the etching time and the etching rate.

As is apparent from the results shown in FIGS. 2 and 3, it was found that the obtained carbon distribution curve had multiple sharp extrema, that the absolute value of the difference between the maximum value and the minimum value of the atomic ratio of carbon was 5 at % or greater, and that the atomic ratio of silicon, the atomic ratio of oxygen, and the atomic ratio of carbon satisfied the requirement represented by the formula (1).

<Electron Beam Transmittance Curve>

An electron beam transmittance curve was created for the obtained gas-barrier multilayer film. The electron beam transmittance curve represents the relationship between the distance (z) from a reference plane (a predetermined surface in parallel with the surface of the thin film layer) in the film thickness direction of the thin film layer and the electron beam transmittance (T). Specifically, first, a protective layer was formed on the surface of the thin film layer of the obtained gas-barrier multilayer film. Then, the gas-barrier multilayer film was cut in a direction perpendicular to the film surface by using a focused ion beam (FIB). Thus, a sample having a thickness of 100 nm was formed. Then, the cut surface (the surface perpendicular to the film surface) of the obtained sample was observed by using a transmission electron microscope (TEM, manufactured by Hitachi, Ltd., model No. "FE-SEM HF-2000"), and a TEM image thereof (magnification: 100,000 times) was obtained. Part (a) of FIG. 4 shows the obtained result.

Figure 4:
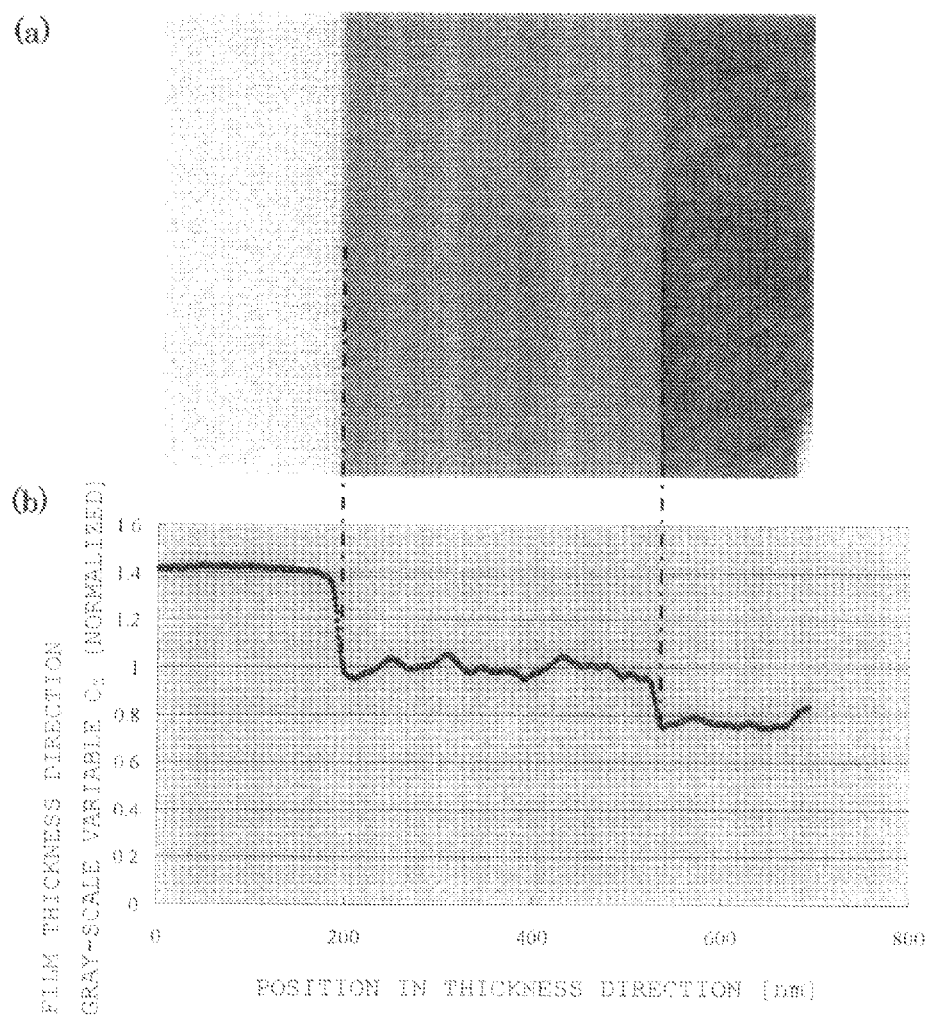
FIG. 4 Part (a) of FIG. 4 shows a transmission electron microscope (TEM) photograph of a cross section of the thin film layer of the gas-barrier multilayer film obtained in Example 1, and Part (b) of FIG. 4 is a graph showing the relationship between the distance from a reference plane in the film thickness direction and the electron beam transmittance of the thin film layer of the gas-barrier multilayer film obtained in Example 1.

In the thus obtained TEM image shown in Part (a) of FIG. 4, the film thickness direction of the thin film layer is the same as the lateral direction in the image. Note that the measurement conditions were such that the acceleration voltage was 200 kV, and the objective aperture was 160 μm. A banded pattern was observed in the obtained TEM image.

Next, the obtained TEM image was read into a personal computer. Then, by using image processing software (manufactured by Adobe Systems Incorporated, trade name "Adobe PhotoShop Elements 7"), the image was rotated so that the film thickness direction of the thin film layer could be in the longitudinal direction on a screen, and apart of the image was cut out to thereby obtain a gray-scale image. The thus cut-out gray-scale image was divided into a grid having unit regions of 700 units in the longitudinal direction (the film thickness direction) and 500 units in the lateral direction (the film surface direction). Note that 200 nm corresponded to the length of 202 unit regions in the obtained gray-scale image. Then, a cross section gray-scale variable (C) was provided to each unit region in the obtained gray-scale image in accordance with the degree of the gray scale thereof. Specifically, a case where the pixel was pure black was regarded as 0, and a case where the pixel was pure white was regarded as 255, and a cross section gray-scale variable (C) ranging from 0 to 255 was provided to each unit region in accordance with the degree of the gray scale thereof. The operations for such division and provision of the cross section gray-scale variables were conducted by using image analysis software (manufactured by Rigaku Corporation, trade name "Rigaku R-AXIS Display Software Ver. 1.18").

Subsequently, for each position in the longitudinal direction (the film thickness direction), an average value (an average value for 500 unit regions arranged laterally) in the lateral direction (film surface direction) was calculated to obtain a film thickness direction gray-scale variable ($C_z$). Moreover, by the simple moving average method, the noise in the film thickness direction gray-scale variable ($C_z$) was removed, and then normalization was conducted such that the average value of the film thickness direction gray-scale variables ($C_z$) in a range corresponding to the thin film layer was 1. Then, an electron beam transmittance curve was formed in which the relationship between the distance (z) from the reference plane in the film thickness direction of the thin film layer and the film thickness direction gray-scale variable ($C_z$) in the gas-barrier multilayer film. Note that, in creating the electron beam transmittance curve, a plane in parallel with a surface of the thin film layer near the interface between the base member and the thin film layer was taken as a reference plane in the film thickness direction of the thin film layer. Part (b) of FIG. 4 shows the obtained results. Note that, since the film thickness direction gray-scale variable ($C_z$) is in a proportional relationship to the electron beam transmittance (T), FIG. 4 shows the relationship between the distance (z) from the reference plane in the film thickness direction of the thin film layer and the electron beam transmittance (T) of the gas-barrier multilayer film obtained in Example 1.

As is apparent from the results shown in Part (b) of FIG. 4, it was found that the obtained electron beam transmittance curve had multiple sharp extrema. For the range corresponding to the thin film layer, i.e., for a range where the distance (z) from the reference plane in the film thickness direction of the thin film layer was 210 nm to 520 nm, the slope ($dC_z/dz$) was calculated by differentiating the film thickness direction gray-scale variable ($C_z$) with respect to the distance (z) from the reference plane in the film thickness direction of the thin film layer, and the maximum value and the minimum value thereof were found. As a result, the maximum value was $3.79 \times 10^{-3}$ $nm^{-1}$, and the minimum value was $-4.75 \times 10^{-3}$ $nm^{-1}$. In addition, the absolute value of the difference between the maximum value and the minimum value was $8.54 \times 10^{-3}$ $nm^{-1}$. Moreover, in the obtained electron beam transmittance curve, portions were observed in each of which the absolute value of the difference between a local maximum and a local minimum of the film thickness direction gray-scale variable ($C_z$) which were adjacent to each other was 0.03 or greater.

Example 2

First, a gas-barrier multilayer film (I) was obtained in the same manner as in Example 1, except that the gas-barrier multilayer film obtained in Example 1 whose thin film layer had a thickness of 0.3 μm was used as the film 100, and mounted onto the feed roll 11, and that another thin film layer was formed on the surface of the thin film layer. Note that the thickness of the thin film layer on the base member (PEN film) in the obtained gas-barrier multilayer film (I) was 0.6 μm.

Thereafter, a gas-barrier multilayer film (II) was obtained in the same manner as in Example 1, except that the obtained gas-barrier multilayer film (I) was used as the film 100, and mounted onto the feed roll 11, and that another thin film layer was formed on the surface of the thin film layer.

The thickness of the thin film layer in the thus obtained gas-barrier multilayer film (II) was 0.9 μm. In addition, the water vapor permeability of the obtained gas-barrier multilayer film (II) was $6.9 \times 10^{-4}$ g/(m²·day) under the conditions of a temperature of 40° C., a humidity on a lower humidity side of 0% RH, and a humidity on a higher humidity side of 90% RH. The value of the water vapor permeability thereof was not greater than the detection limit, under the conditions of a temperature of 40° C., a humidity on a lower humidity side of 10% RH, and a humidity on a higher humidity side of 100% RH. Moreover, after the obtained gas-barrier multilayer film was bent under a condition of a radius of curvature of 8 mm, the value of the water vapor permeability thereof was not greater than the detection limit, under the conditions of a temperature of 40° C., a humidity on a lower humidity side of 10% RH, and a humidity on a higher humidity side of 100% RH. It was found that, even when the obtained gas-barrier multilayer film (II) was bent, it was possible to sufficiently suppress the degradation in gas barrier properties.

<Silicon Distribution Curve, Oxygen Distribution Curve, Carbon Distribution Curve, and Oxygen-Carbon Distribution Curve>

Figure 5:
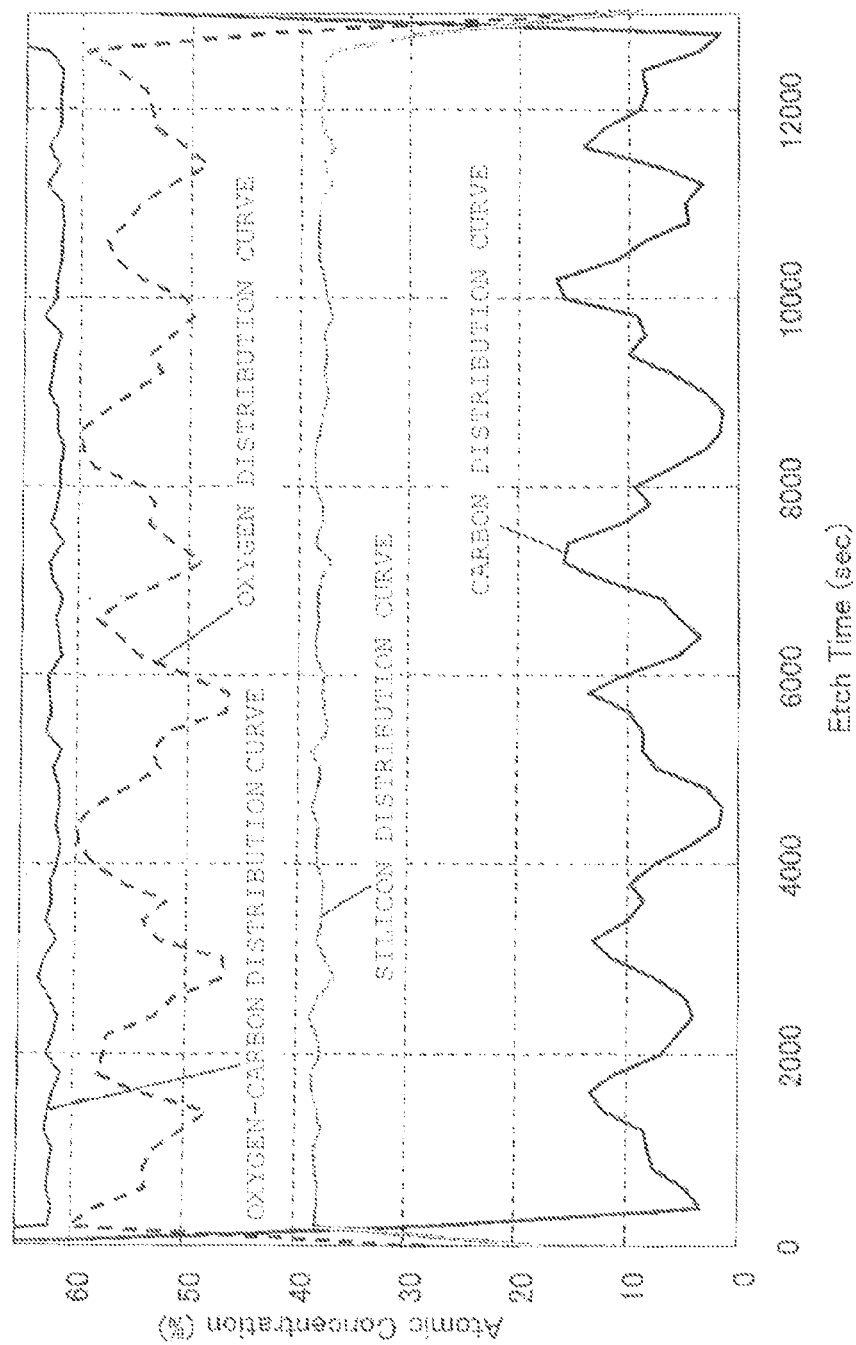
FIG. 5 is a graph showing the silicon distribution curve, the oxygen distribution curve, the carbon distribution curve, and the oxygen-carbon distribution curve of the gas-barrier multilayer film obtained in Example 2.
Figure 6:
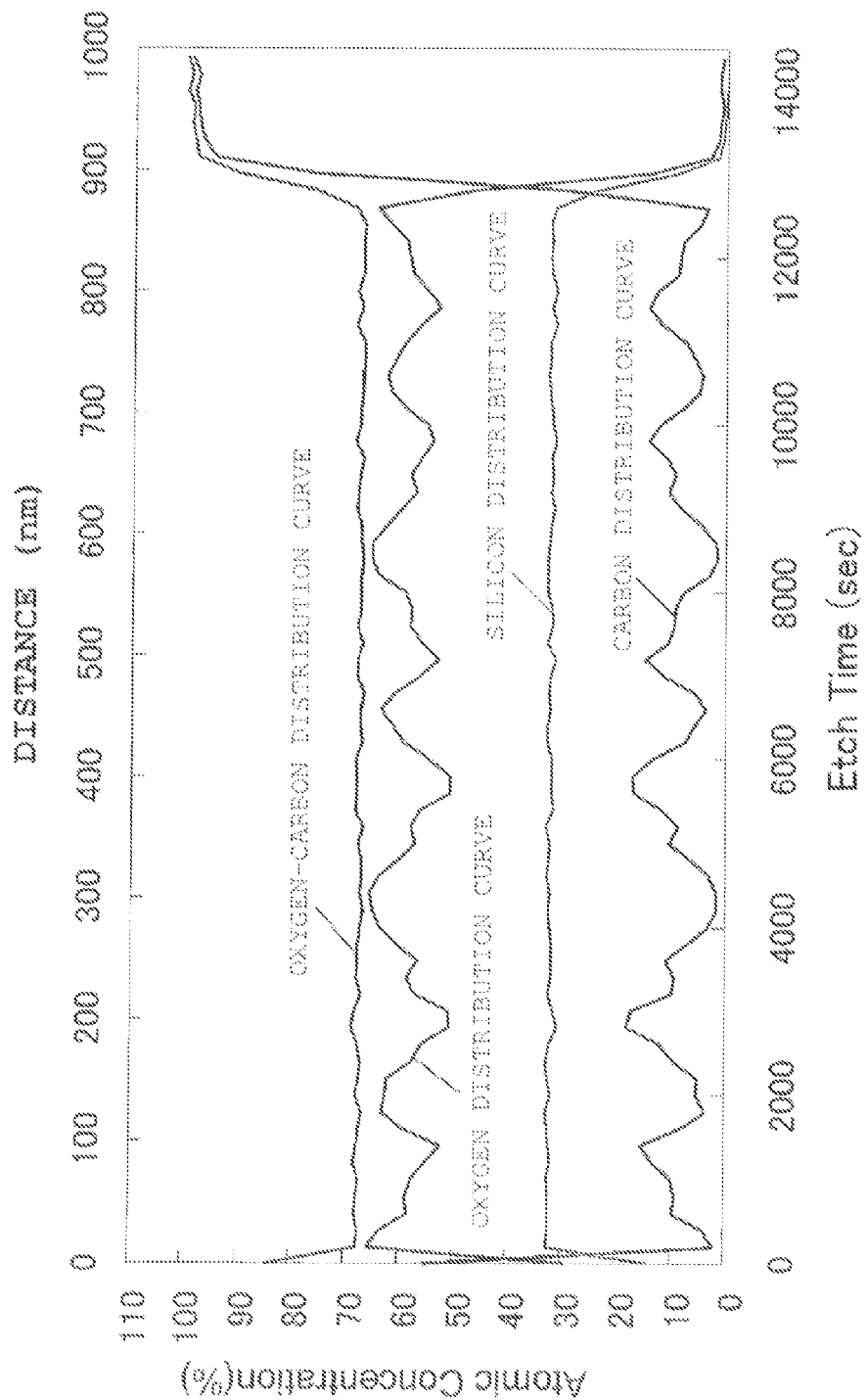
FIG. 6 is a graph showing the silicon distribution curve, the oxygen distribution curve, the carbon distribution curve, and the oxygen-carbon distribution curve of the gas-barrier multilayer film obtained in Example 2.

A silicon distribution curve, an oxygen distribution curve, a carbon distribution curve, and an oxygen-carbon distribution curve were created for the obtained gas-barrier multilayer film (II) in the same manner as in Example 1. FIG. 5 shows the obtained results. In addition, FIG. 6 shows a graph illustrating the relationship between each atomic ratio and etching time and also the relationship between each atomic ratio and the distance (nm) from the surface of the thin film layer in the obtained silicon distribution curve, oxygen distribution curve, carbon distribution curve, and oxygen-carbon distribution curve. Note that the "distance (nm)" shown on the horizontal axis of the graph shown in FIG. 6 is a value obtained through calculation based on the etching time and the etching rate.

As is apparent from the results shown in FIGS. 5 and 6, it was found that the obtained carbon distribution curve had multiple sharp extrema, that the absolute value of the difference between the maximum value and the minimum value of the atomic ratio of carbon was 5 at % or greater, and that the atomic ratio of silicon, the atomic ratio of oxygen, and the atomic ratio of carbon satisfied the requirement represented by the formula (1).

<Electron Beam Transmittance Curve>

A TEM image (magnification: 100,000 times) was obtained for the obtained gas-barrier multilayer film (II) in the same manner as in Example 1. Then, an electron beam transmittance curve, which represents the relationship between the distance (z) from a reference plane (a predetermined plane in parallel with the surface of the thin film layer) in the film thickness direction of the thin film layer and the electron beam transmittance (T), was created on the basis of the TEM image in basically the same manner as in Example 1, except for the following points. Specifically, in creating the electron beam transmittance curve, noise was removed from the film thickness direction gray-scale variable ($C_z$) by using the simple moving average method. First, tentative interface positions were found from the gray-scale image obtained from the TEM image to be 25 nm and 990 nm, and then interfaces positions were set at 50 nm and 920 nm on the basis of the slope ($dC_z/dz$) of the film thickness direction gray-scale variable ($C_z$). In addition, in creating the electron beam transmittance curve, normalization was conducted such that the average value of the film thickness direction gray-scale variable ($C_z$) in the range located inside the interface positions and corresponding to the thin film layer was 1. Moreover, in creating the electron beam transmittance curve, a plane in parallel with the surface of the thin film layer near the interface between the base member and the thin film layer was taken as a reference plane in the film thickness direction of the thin film layer.

Figure 7:
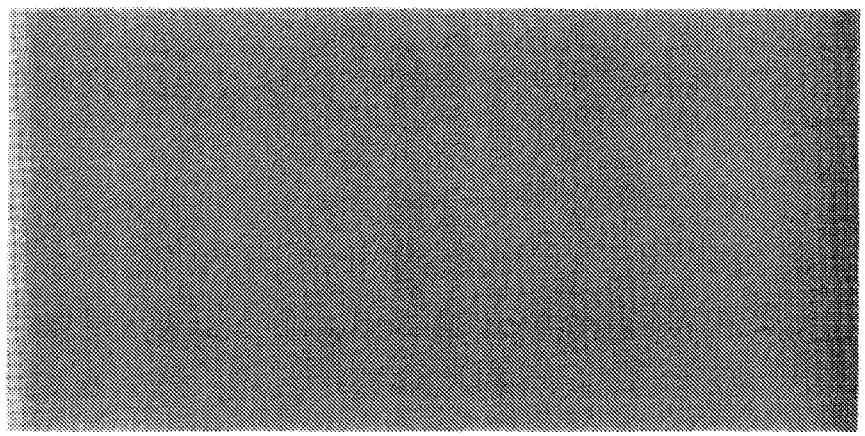
FIG. 7 is a transmission electron microscope (TEM) photograph showing a cross section of the thin film layer of the gas-barrier multilayer film (B) obtained in Example 2.
Figure 8:
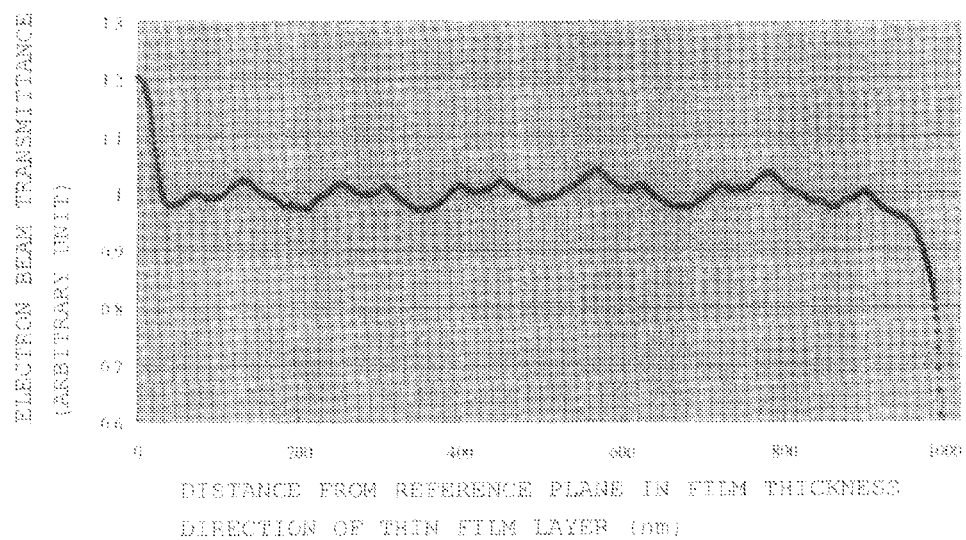
FIG. 8 is a graph showing the relationship between the distance from a reference plane in the film thickness direction and the electron beam transmittance of the thin film layer of the gas-barrier multilayer film (B) obtained in Example 2.

As the thus obtained results, the transmission electron microphotograph of the gas-barrier multilayer film (B) is shown in FIG. 7, and the electron beam transmittance curve thereof is shown in FIG. 8. Note that, since the film thickness direction gray-scale variable ($C_z$) is in a proportional relationship to the electron beam transmittance (T), FIG. 8 shows the relationship between the distance (z) from the reference plane in the film thickness direction of the thin film layer and the electron beam transmittance (T) of the gas-barrier multilayer film obtained in Example 2.

As is apparent from the results shown in FIG. 8, it was found that the obtained electron beam transmittance curve had multiple sharp extrema. For the range corresponding to the thin film layer, i.e., for a range where the distance (z) from the reference plane in the film thickness direction of the thin film layer was 50 nm to 920 nm, the slope ($dC_z/dz$) was calculated by differentiating the film thickness direction gray-scale variable ($C_z$) with respect to the distance (z) from the reference plane in the film thickness direction of the thin film layer, and the maximum value and the minimum value of the slope were found. As a result, the maximum value of the slope was $1.59 \times 10^{-3}$ nm$^{-1}$, and the minimum value of the slope was $-1.82 \times 10^{-3}$ nm$^{-1}$. In addition, the absolute value of the difference between the maximum value and the minimum value of the slope was $3.41 \times 10^{-3}$ nm$^{-1}$. Moreover, in the obtained electron beam transmittance curve, portions were observed in each of which the absolute value of the difference between a local maximum and a local minimum of the film thickness direction gray-scale variable ($C_z$) which were adjacent to each other was 0.03 or greater.

Example 3

A gas-barrier multilayer film was obtained in the same manner as in Example 1, except that the amount of supplied raw material gas was 100 sccm.

The thickness of the thin film layer in the thus obtained gas-barrier multilayer film was 0.6 μm. In addition, the water vapor permeability of the obtained gas-barrier multilayer film was $3.2 \times 10^{-4}$ g/(m²·day) under the conditions of a temperature of 40° C., a humidity on a lower humidity side of 0% RH, and a humidity on a higher humidity side of 90% RH. The value of the water vapor permeability thereof was not greater than the detection limit, under the conditions of a temperature of 40° C., a humidity on a lower humidity side of 10% RH, and a humidity on a higher humidity side of 100% RH. Moreover, after the obtained gas-barrier multilayer film was bent under a condition of a radius of curvature of 8 mm, the value of the water vapor permeability thereof was not greater than the detection limit, under the conditions of a temperature of 40° C., a humidity on a lower humidity side of 10% RH, and a humidity on a higher humidity side of 100% RH. It was found that, even when the obtained gas-barrier multilayer film was bent, it was possible to sufficiently suppress the degradation in gas barrier properties.

<Silicon Distribution Curve, Oxygen Distribution Curve, Carbon Distribution Curve, and Oxygen-Carbon Distribution Curve>

Figure 9:
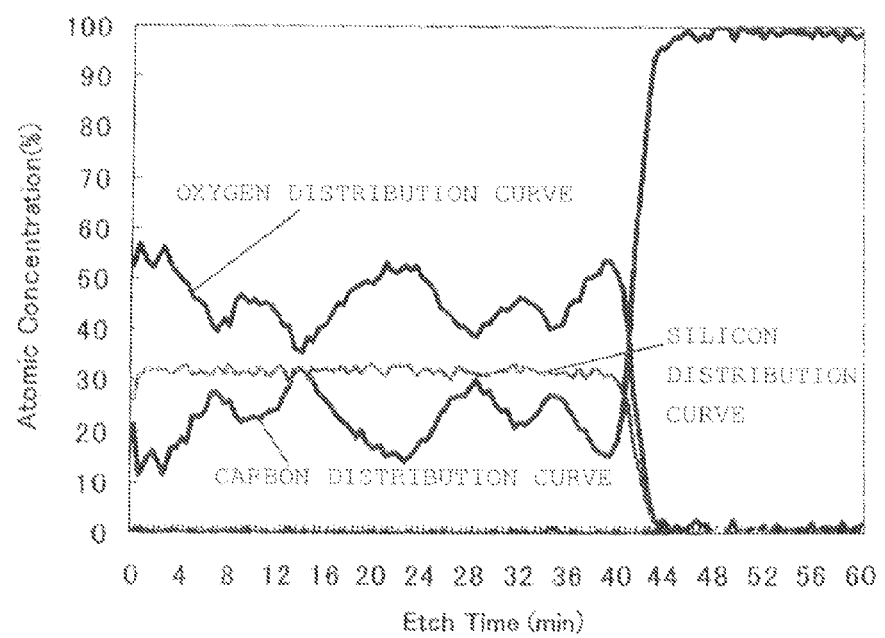
FIG. 9 is a graph showing the silicon distribution curve, the oxygen distribution curve, and the carbon distribution curve of the gas-barrier multilayer film obtained in Example 3.
Figure 10:
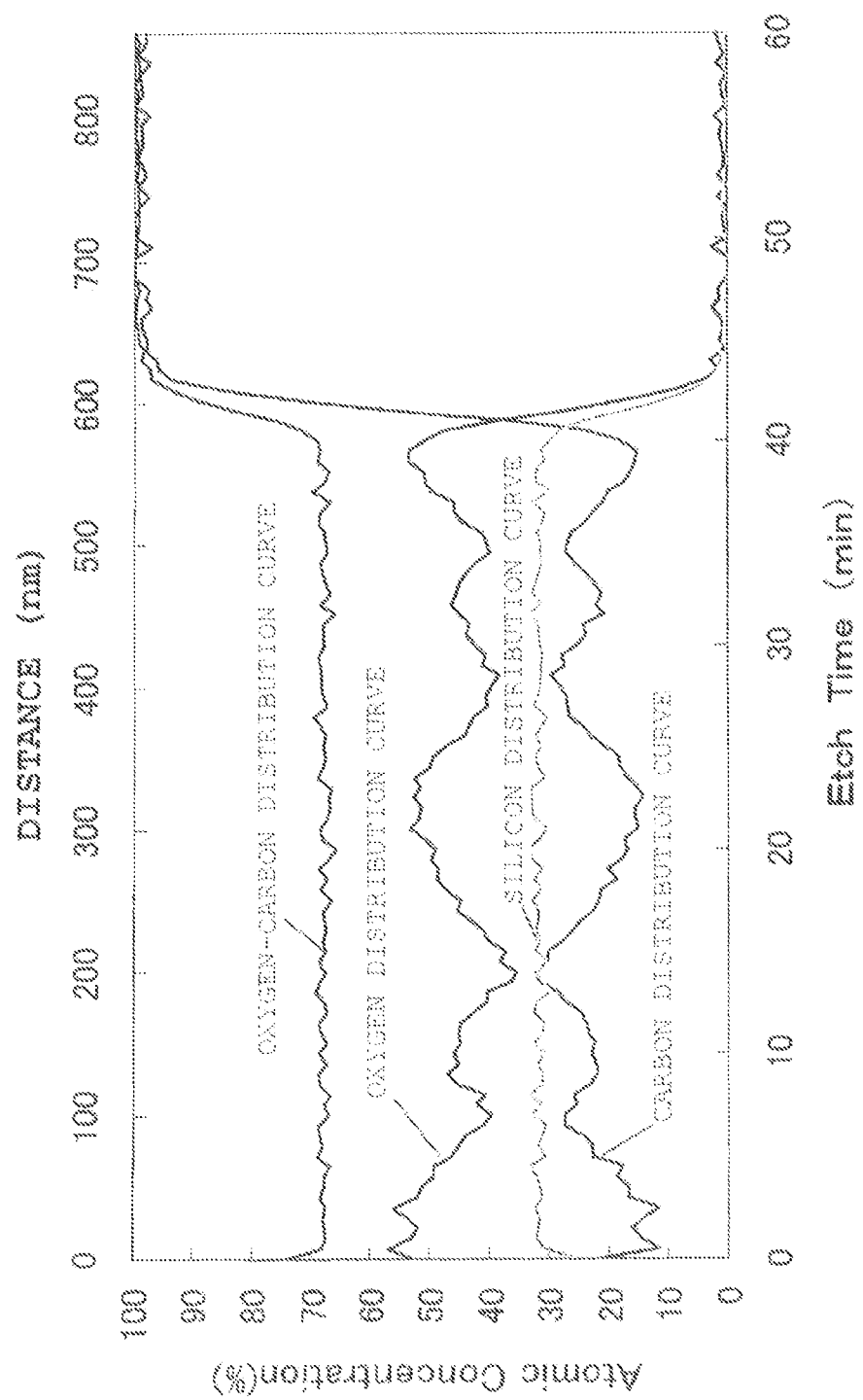
FIG. 10 is a graph showing the silicon distribution curve, the oxygen distribution curve, the carbon distribution curve, and the oxygen-carbon distribution curve of the gas-barrier multilayer film obtained in Example 3.

A silicon distribution curve, an oxygen distribution curve, a carbon distribution curve, and an oxygen-carbon distribution curve were created for the obtained gas-barrier multilayer film in the same manner as in Example 1. FIG. 9 shows the obtained silicon distribution curve, oxygen distribution curve, and carbon distribution curve. In addition, FIG. 10 shows a graph illustrating the relationship between each atomic ratio and etching time and also the relationship between each atomic ratio and the distance (nm) from the surface of the thin film layer in the obtained silicon distribution curve, oxygen distribution curve, carbon distribution curve, and oxygen-carbon distribution curve. Note that the "distance (nm)" shown on the horizontal axis of the graph shown in FIG. 10 is a value obtained through calculation based on the etching time and the etching rate.

As is apparent from the results shown in FIGS. 9 and 10, it was found that the obtained carbon distribution curve had multiple sharp extrema, that the absolute value of the difference between the maximum value and the minimum value of the atomic ratio of carbon was 5 at % or greater, and that the atomic ratio of silicon, the atomic ratio of oxygen, and the atomic ratio of carbon satisfied the requirement represented by the formula (1).

Comparative Example 1

A thin film layer made of silicon oxide was formed by a reaction sputtering method on a surface of a biaxially-oriented polyethylene naphthalate film (PEN film, thickness: 100 μm, width: 350 mm, manufactured by Teijin DuPont Films Japan Limited, trade name "Teonex Q65FA") by using a silicon target in an oxygen-containing gas atmosphere. Thus, a gas-barrier multilayer film for comparison was obtained.

The thickness of the thin film layer in the obtained gas-barrier multilayer film was 100 nm. In addition, the water vapor permeability of the obtained gas-barrier multilayer film was 1.3 g/(m²·day) under the conditions of a temperature of 40° C., a humidity on a lower humidity side of 10% RH, and a humidity on a higher humidity side of 100% RH. This indicated that the gas barrier properties were insufficient.

<Silicon Distribution Curve, Oxygen Distribution Curve, Carbon Distribution Curve, and Oxygen-Carbon Distribution Curve>

Figure 11:
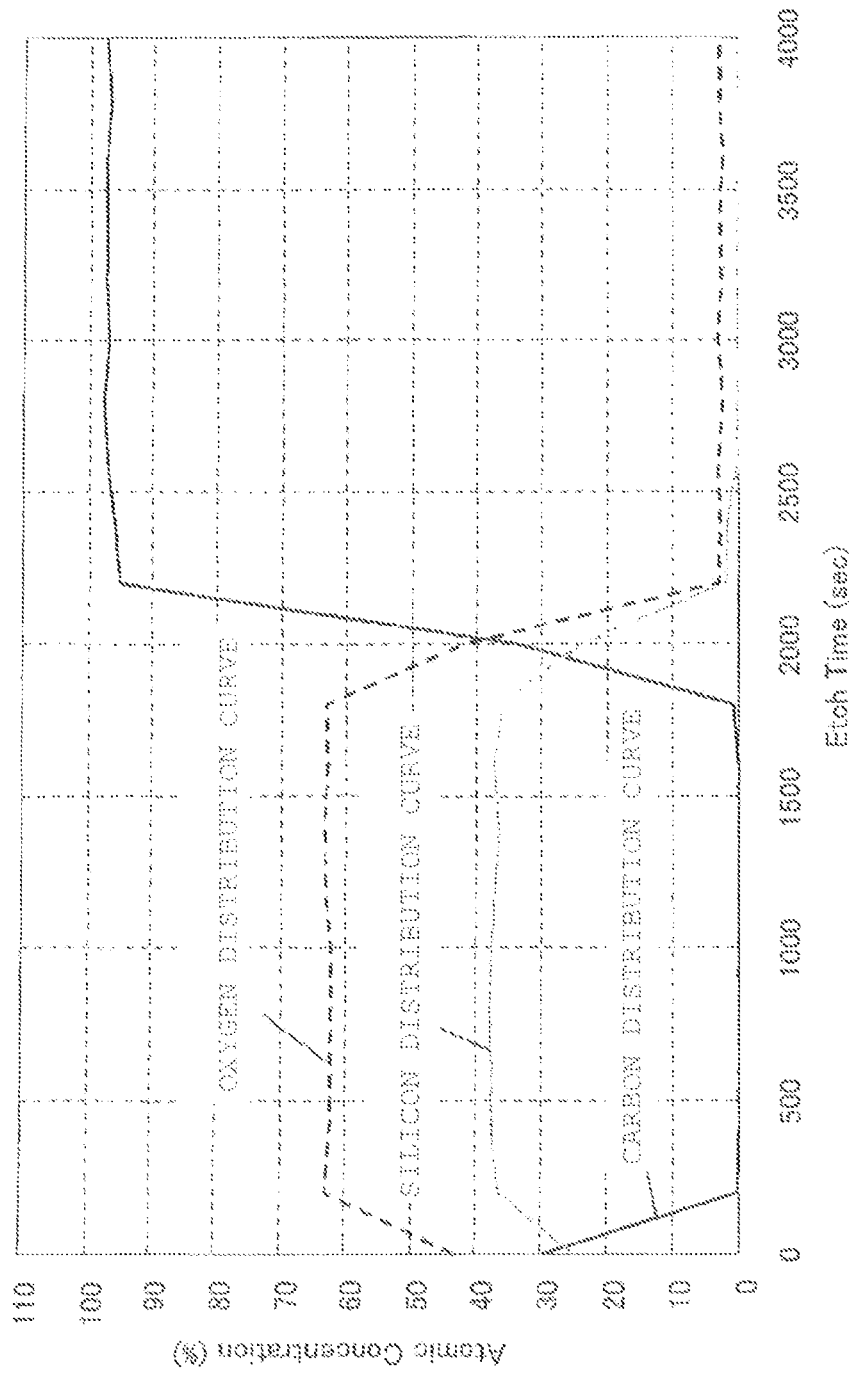
FIG. 11 is a graph showing the silicon distribution curve, the oxygen distribution curve, and the carbon distribution curve of the gas-barrier multilayer film obtained in Comparative Example 1.
Figure 12:
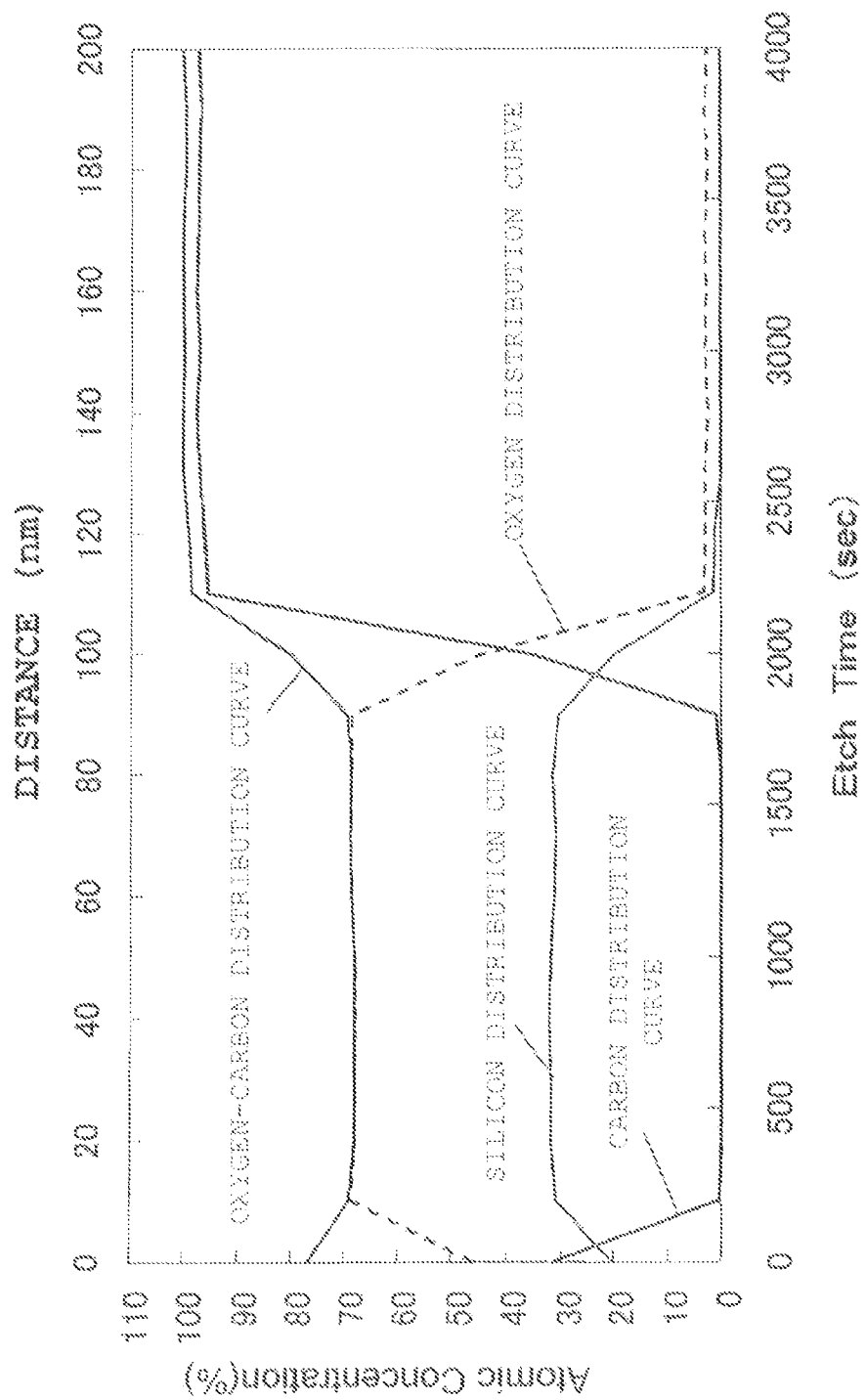
FIG. 12 is a graph showing the silicon distribution curve, the oxygen distribution curve, the carbon distribution curve, and the oxygen-carbon distribution curve of the gas-barrier multilayer film obtained in Comparative Example 1.

A silicon distribution curve, an oxygen distribution curve, a carbon distribution curve, and an oxygen-carbon distribution curve were created for the obtained gas-barrier multilayer film in the same manner as in Example 1. FIG. 11 shows the obtained silicon distribution curve, oxygen distribution curve, and carbon distribution curve. In addition, FIG. 12 shows a graph illustrating the relationship between each atomic ratio and etching time and also the relationship between each atomic ratio and the distance (nm) from the surface of the thin film layer in the obtained silicon distribution curve, oxygen distribution curve, carbon distribution curve, and oxygen-carbon distribution curve. Note that the "distance (nm)" shown on the horizontal axis of the graph shown in FIG. 12 is a value obtained through calculation based on the etching time and the etching rate.

As is apparent from the results shown in FIGS. 11 and 12, it was found that the obtained carbon distribution curve had no extrema.

<Electron Beam Transmittance Curve>

A TEM image (magnification: 100,000 times) was obtained for the obtained gas-barrier multilayer film in the same manner as in Example 1. Then, an electron beam transmittance curve was formed, which represents the relationship between the distance (z) from a reference plane (a predetermined plane in parallel with the surface of the thin film layer) in the film thickness direction of the thin film layer and the electron beam transmittance (T), on the basis of the TEM image in basically the same manner as in Example 1, except for the following points. Note that, in creating the electron beam transmittance curve in Comparative Example 1, the surface of the protective layer (a layer produced in forming the sample) was taken as the reference plane in the film thickness direction of the thin film layer.

Figure 13:
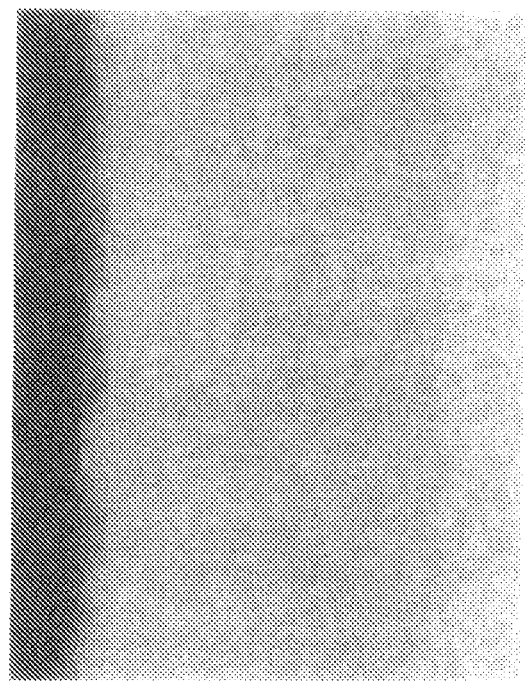
FIG. 13 is a transmission electron microscope photograph showing a cross section of the thin film layer of the gas-barrier multilayer film obtained in Comparative Example 1.
Figure 14:
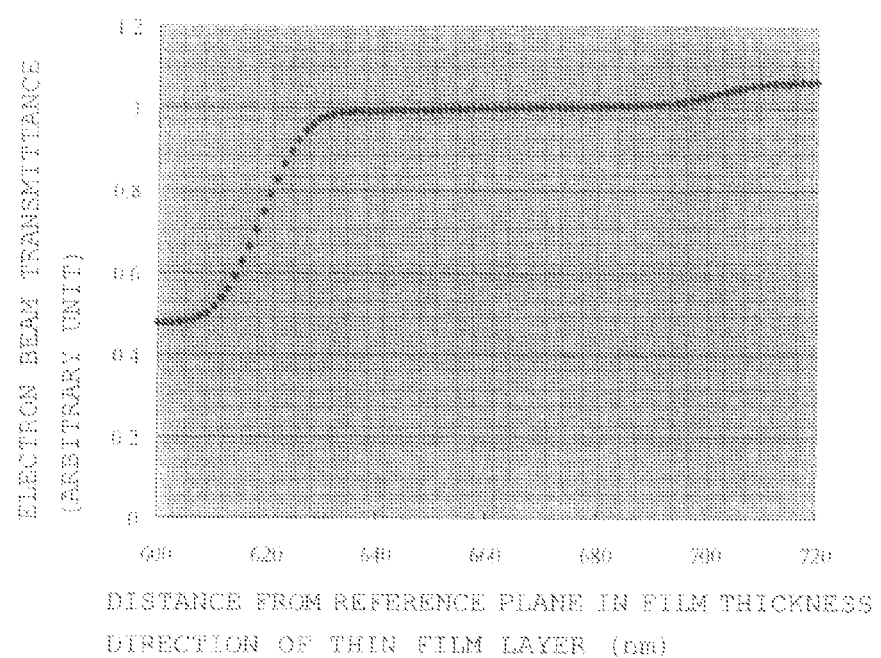
FIG. 14 is a graph showing the relationship between the distance from a reference plane in the film thickness direction and the electron beam transmittance of the thin film layer of the gas-barrier multilayer film obtained in Comparative Example 1.

FIG. 13 shows the transmission electron microscope photograph of the thus obtained gas-barrier multilayer film, and FIG. 14 shows the electron beam transmittance curve thereof. Note that, in the TEM image shown in FIG. 13, the film thickness direction of the thin film layer is the same as the lateral direction of the image.

As is apparent also from the results shown in FIG. 14, it was found that the obtained electron beam transmittance curve had no extrema. In addition, for the range corresponding to the thin film layer, i.e., for a range where the distance (z) from the reference plane in the film thickness direction of the thin film layer was 640 to 690 nm, the slope ($dC_z/dz$) was calculated by differentiating the film thickness direction gray-scale variable ($C_z$) with respect to the distance (z) from the reference plane in the film thickness direction of the thin film layer, and the maximum value and the minimum value of the slope were found. As a result, the maximum value of the slope was $0.477 \times 10^{-3}$ nm$^{-1}$, and the minimum value of the slope was $0.158 \times 10^{-3}$ nm$^{-1}$. Also from the fact that both the maximum value and the minimum value of the slope were positive values as described above, it was understood that the obtained electron beam transmittance curve had no extrema. In addition, the absolute value of the difference between the maximum value and the minimum value was $0.319 \times 10^{-3}$ nm$^{-1}$.

Comparative Example 2

A gas-barrier multilayer film was produced in the same manner as in Example 1, except that a thin film was formed by a plasma enhanced CVD method under film formation conditions which were changed to the following conditions.

<Film Formation Conditions>
Mixing ratio of film-forming gas (hexamethyldisiloxane/oxygen): 25/500 [Unit: sccm (Standard Cubic Centimeter per Minute)]
Degree of vacuum in vacuum chamber: 3 Pa
Electrical power applied by plasma generation power source: 0.8 kW
Frequency of plasma generation power source: 70 kHz
Transfer rate of film: 0.5 m/min.

The thickness of the thin film layer in the thus obtained gas-barrier multilayer film was 190 nm. In addition, the water vapor permeability of the obtained gas-barrier multilayer film was $7.5 \times 10^{-3}$ g/(m²·day) under the conditions of a temperature of 40° C., a humidity on a lower humidity side of 0% RH, and a humidity on a higher humidity side of 90% RH. Meanwhile, the value of the water vapor permeability thereof was not greater than the detection limit, under the conditions of a temperature of 40° C., a humidity on a lower humidity side of 10% RH, and a humidity on a higher humidity side of 100% RH. Moreover, after the obtained gas-barrier multilayer film was bent under a condition of radius of curvature 8 mm, the water vapor permeability thereof was $2.7 \times 10^{-1}$ g/(m$^2$·day) under the conditions of a temperature of 40° C., a humidity on a lower humidity side of 10% RH, and a humidity on a higher humidity side of 100% RH. This indicated that the gas barrier properties were insufficient.

<Silicon Distribution Curve, Oxygen Distribution Curve, Carbon Distribution Curve, and Oxygen-Carbon Distribution Curve>

Figure 15:
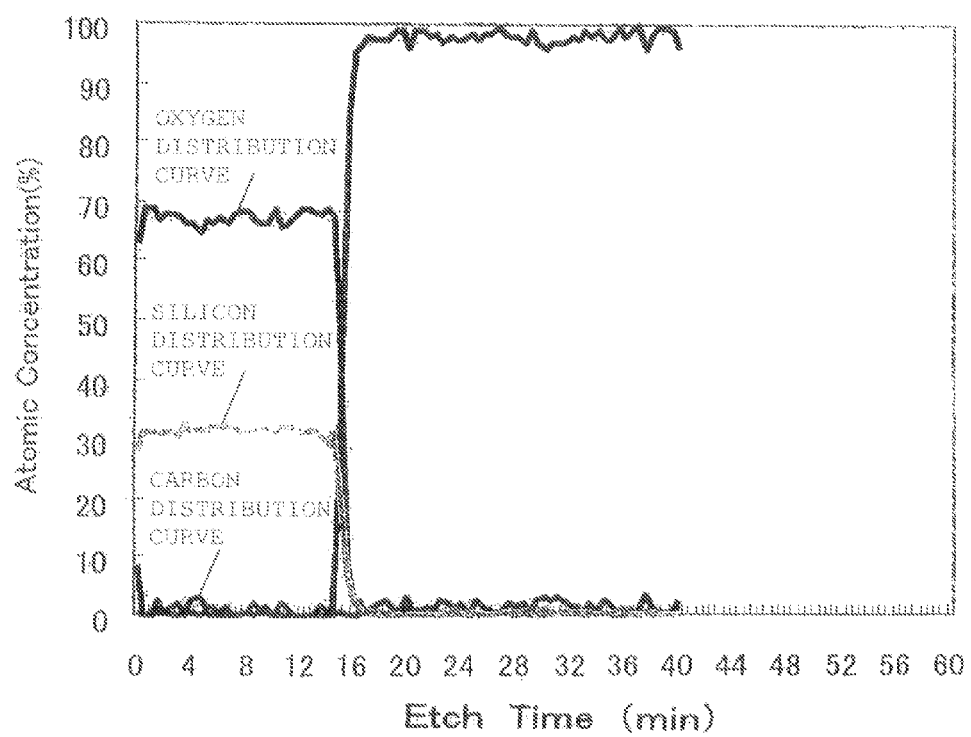
FIG. 15 is a graph showing the silicon distribution curve, the oxygen distribution curve, and the carbon distribution curve of the gas-barrier multilayer film obtained in Comparative Example 2.
Figure 16:
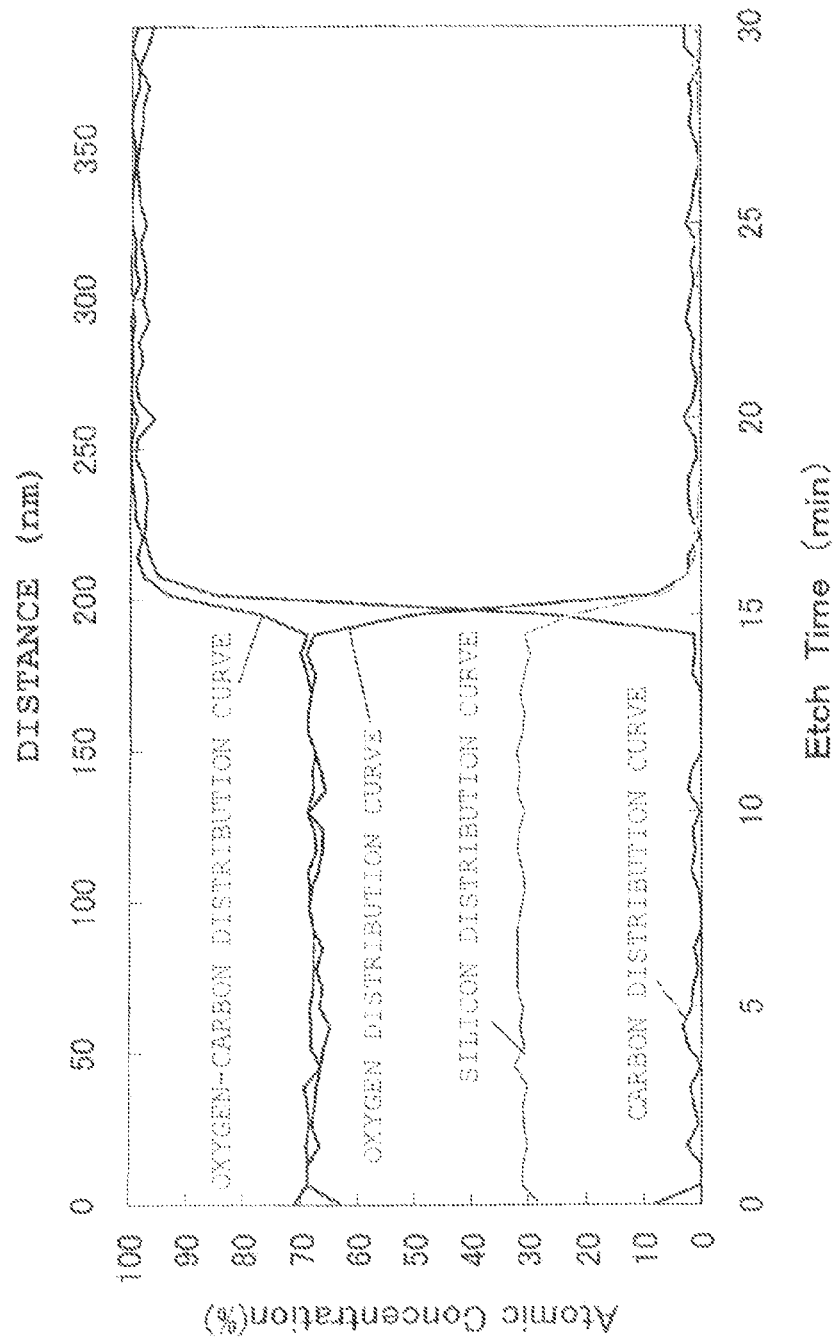
FIG. 16 is a graph showing the silicon distribution curve, the oxygen distribution curve, the carbon distribution curve, and the oxygen-carbon distribution curve of the gas-barrier multilayer film obtained in Comparative Example 2.

A silicon distribution curve, an oxygen distribution curve, a carbon distribution curve, and an oxygen-carbon distribution curve were created for the obtained gas-barrier multilayer film in the same manner as in Example 1. FIG. 15 shows the obtained silicon distribution curve, oxygen distribution curve, and carbon distribution curve. In addition, FIG. 16 shows a graph illustrating the relationship between each atomic ratio and etching time and also the relationship between each atomic ratio and the distance (nm) from the surface of the thin film layer in the obtained silicon distribution curve, oxygen distribution curve, carbon distribution curve, and oxygen-carbon distribution curve. Note that the "distance (nm)" shown on the horizontal axis of the graph shown in FIG. 16 is a value obtained through calculation based on the etching time and the etching rate. As is apparent from the results shown in FIGS. 15 and 16, it was found that the obtained carbon distribution curve had no extrema.

<Electron Beam Transmittance Curve>

Figure 17:
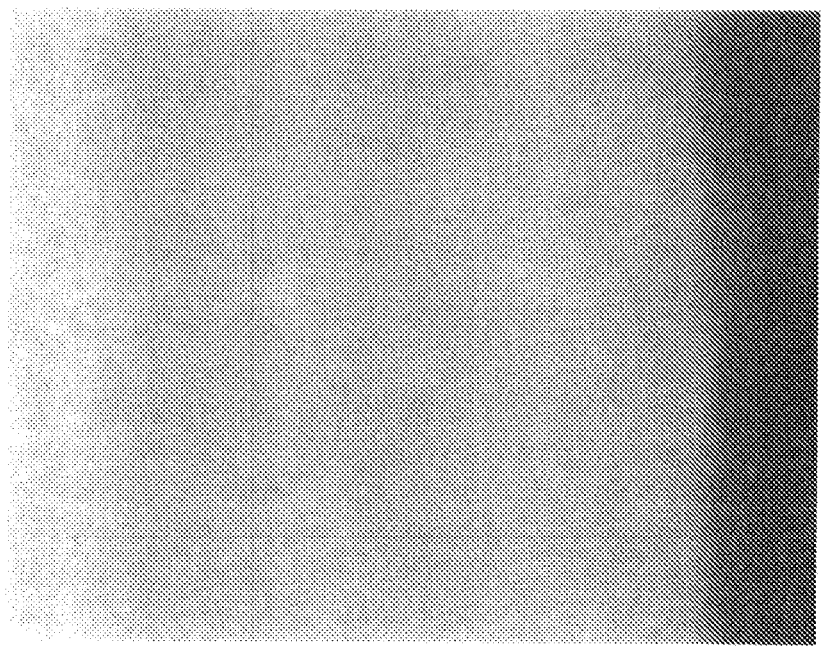
FIG. 17 is a transmission electron microscope photograph showing a cross section of the thin film layer of the gas-barrier multilayer film obtained in Comparative Example 2.
Figure 18:
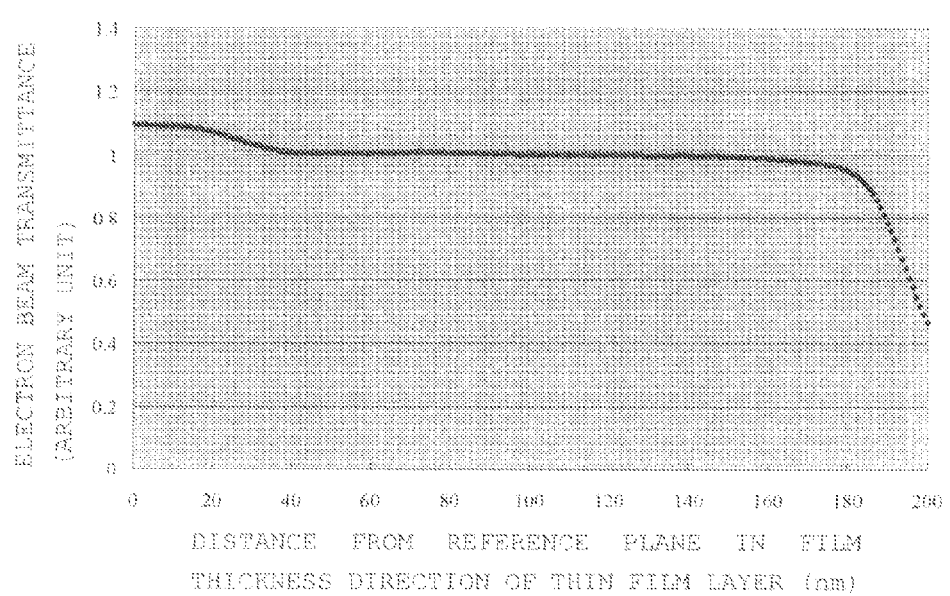
FIG. 18 is a graph showing the relationship between the distance from a reference plane in the film thickness direction and the electron beam transmittance of the thin film layer of the gas-barrier multilayer film obtained in Comparative Example 2.

A TEM image (magnification: 100,000 times) was obtained for the obtained gas-barrier multilayer film in the same manner as in Example 1. Then, an electron beam transmittance curve, which represents the relationship between the distance (z) from a reference plane (a predetermined plane in parallel with the surface of the thin film layer) in the film thickness direction of the thin film layer and the electron beam transmittance (T), was created on the basis of the TEM image in the same manner as in Example 1. FIG. 17 shows the transmission electron microscope photograph of the thus obtained gas-barrier multilayer film, and FIG. 18 shows the electron beam transmittance curve thereof. Note that, in the TEM image shown in FIG. 17, the film thickness direction of the thin film layer is the same as the lateral direction of the image.

As is apparent also from the results shown in FIG. 18, it was found that the obtained electron beam transmittance curve had no extrema. In addition, for the range corresponding to the thin film layer, i.e., for a range where the distance (z) from the reference plane in the film thickness direction of the thin film layer was 400 to 520 nm, the slope ($dC_z/dz$) was calculated by differentiating the film thickness direction gray-scale variable ($C_z$) with respect to the distance (z) from the reference plane in the film thickness direction of the thin film layer, and the maximum value and the minimum value of the slope were found. As a result, the maximum value of the slope was $0.406 \times 10^{-3}$ nm$^{-1}$, and the minimum value of the slope was $-0.548 \times 10^{-3}$ nm$^{-1}$. In addition, the absolute value of the difference between the maximum value and the minimum value was $0.954 \times 10^{-3}$ nm$^{-1}$. Moreover, there is no portion of which the absolute value of the difference between a local maximum and a local minimum of the film thickness direction gray-scale variable ($C_z$) which were adjacent to each other was 0.03 or more in the obtained electron beam transmittance curve. Thereby, it is found that the positive and negative fluctuations of the slope were attributable to the so-called noise.

Comparative Example 3

A gas-barrier multilayer film was produced in the same manner as in Example 1, except that a thin film was formed by a plasma enhanced CVD method under film formation conditions which were changed to the following conditions.

<Film Formation Conditions>

Mixing ratio of film-forming gas (hexamethyldisiloxane/oxygen): 25/1000 [Unit: sccm (Standard Cubic Centimeter per Minute)]

Degree of vacuum in vacuum chamber: 3 Pa

Electrical power applied by plasma generation power source: 0.8 kW

Frequency of plasma generation power source: 70 kHz

Transfer rate of film: 0.5 m/min.

The thickness of the thin film layer in the thus obtained gas-barrier multilayer film was 180 nm. In addition, the water vapor permeability of the obtained gas-barrier multilayer film was 0.022 g/(m$^2$·day) under the conditions of a temperature of 40° C., a humidity on a lower humidity side of 10% RH, and a humidity on a higher humidity side of 100% RH. This indicated that the gas barrier properties were insufficient. In addition, the value of the water vapor permeability thereof was not more than the detection limit, under the conditions of a temperature of 40° C., a humidity on a lower humidity side of 10% RH, and a humidity on a higher humidity side of 100% RH. However, after the thus obtained gas barrier multilayer film was bent under a condition of a radius of curvature of 8 mm, the water vapor permeability thereof was 0.12 g/(m$^2$·day) under the conditions of a temperature of 40° C., a humidity on a lower humidity side of 10% RH, and a humidity on a higher humidity side of 100% RH. In the obtained gas-barrier multilayer film, when the film had been bent, it was not possible to sufficiently suppress the degradation in gas barrier properties.

<Electron Beam Transmittance Curve>

A TEM image (magnification: 100,000 times) was obtained for the obtained gas-barrier multilayer film in the same manner as in Example 1. Then, an electron beam transmittance curve, which represents the relationship between the distance (z) from a reference plane (a predetermined plane in parallel with the surface of the thin film layer) in the film thickness direction of the thin film layer and the electron beam transmittance (T), was created on the basis of the TEM image in basically the same manner as in Example 1, except for the following points. Specifically, in creating the electron beam transmittance curve, the surface of the protective layer was taken as the reference plane in the film thickness direction of the thin film layer. In addition, in creating the electron beam transmittance curve, 200 nm in the obtained gray-scale image corresponded to the length of 194 unit regions.

Figure 19:
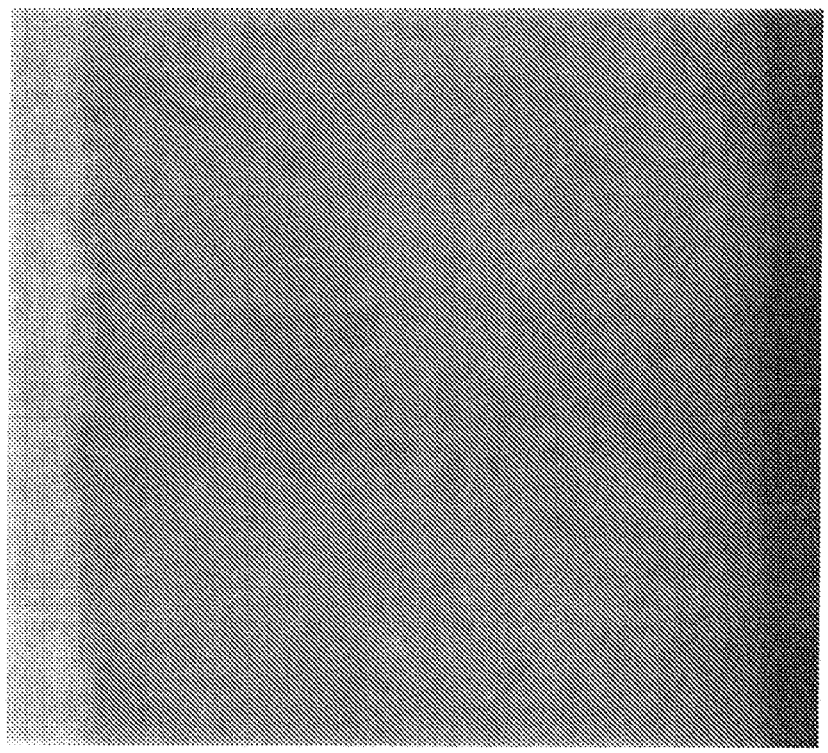
FIG. 19 is a transmission electron microscope photograph showing a cross section of the thin film layer of the gas-barrier multilayer film obtained in Comparative Example 3.
Figure 20:
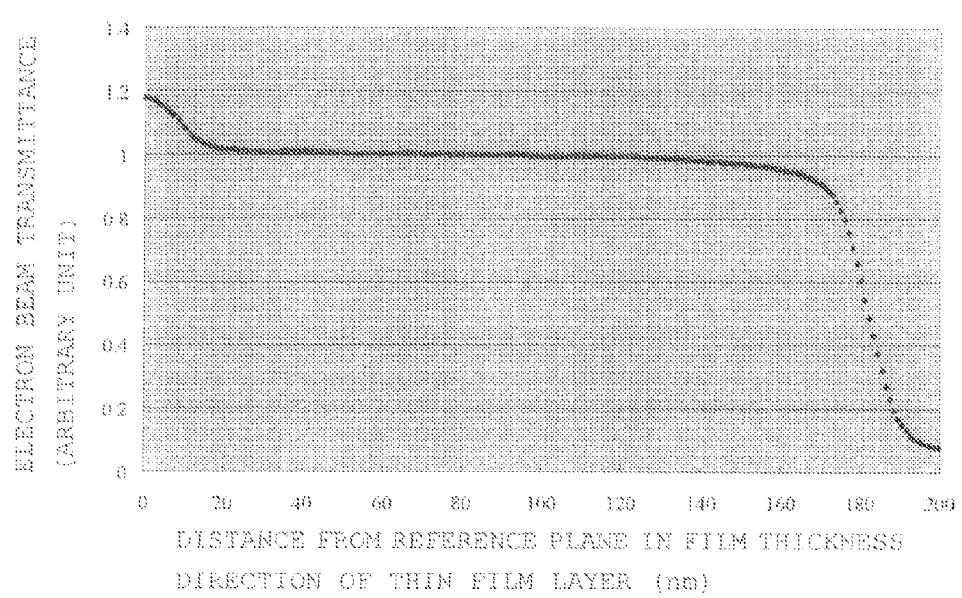
FIG. 20 is a graph showing the relationship between the distance from a reference plane in the film thickness direction and the electron beam transmittance of the thin film layer of the gas-barrier multilayer film obtained in Comparative Example 3.

FIG. 19 shows the transmission electron microscope photograph of the thus obtained gas-barrier multilayer film, and FIG. 20 shows the electron beam transmittance curve thereof. Note that, in the TEM image shown in FIG. 19, the film thickness direction of the thin film layer is the same as the lateral direction of the image.

As is apparent also from the results shown in FIG. 20, it was found that the obtained electron beam transmittance curve had no extrema. In addition, for the range corresponding to the thin film layer, i.e., for a range where the distance (z) from the reference plane in the film thickness direction of the thin film layer was 480 to 580 nm, the slope ($dC_z/dz$) was calculated by differentiating the film thickness direction gray-scale variable ($C_z$) with respect to the distance (z) from the reference plane in the film thickness direction of the thin film layer, and the maximum value and the minimum value of the slope were found. As a result, the maximum value of the slope was $0.342\times10^{-3}$ nm$^{-1}$, and the minimum value of the slope was $-0.887\times10^{-3}$ nm$^{-1}$. In addition, the absolute value of the difference between the maximum value and the minimum value was $1.23\times10^{-3}$ nm$^{-1}$. Moreover, there is no portion of which the absolute value of the difference between a local maximum and a local minimum of the film thickness direction gray-scale variable ($C_z$) which were adjacent to each other was 0.03 or more in the obtained electron beam transmittance curve. Thereby, it is found that the positive and negative fluctuations of the slope were attributable to the so-called noise.

INDUSTRIAL APPLICABILITY

As described above, the present invention makes it possible to provide a gas-barrier multilayer film which has sufficient gas barrier properties, and moreover which makes it possible to sufficiently suppress the degradation in gas barrier properties even when the film is bent.

Accordingly, the gas-barrier multilayer film of the present invention can be used suitably for flexible lighting devices using organic electroluminescent elements (organic EL elements), organic thin film solar cells, liquid crystal displays, packaging containers for pharmaceuticals, and the like.

REFERENCE SIGNS LIST

11: feed roll
21, 22, 23, 24: transfer roll
31, 32: film forming roll
41: gas supply pipe
51: plasma generation power source
61, 62: magnetic field generation apparatus
71: winding roll
100: film

The invention claimed is:
1. A gas-barrier multilayer film comprising:
a base member; and
at least one thin film layer formed on at least one surface of the base member, wherein
at least one layer of the thin film layer(s) satisfies the following requirement (A):
[Requirement (A)]
the layer contains silicon, oxygen, and carbon, and
in a silicon distribution curve, an oxygen distribution curve, and a carbon distribution curve all the following requirements (i) to (iii) are satisfied, each of the silicon distribution curve, the oxygen distribution curve, and the carbon distribution curve representing the relationship between the distance from a surface of the layer in the film thickness direction of the layer and corresponding one of the ratio of the amount of silicon atoms to the total amount of silicon atoms, oxygen atoms, and carbon atoms (the atomic ratio of silicon), the ratio of the amount of oxygen atoms to said total amount (the atomic ratio of oxygen), and the ratio of the amount of carbon atoms to said total amount (the atomic ratio of carbon):
(i) the atomic ratio of silicon, the atomic ratio of oxygen, and the atomic ratio of carbon satisfy, in any region corresponding to 90% or more of the thickness of the layer, a requirement represented by the following formula (1):

(atomic ratio of oxygen)>(atomic ratio of silicon)>(atomic ratio of carbon)　　(1), the atomic ratio of the content of silicon atoms to the total amount of silicon atoms, oxygen atoms and carbon atoms is 30 to 40 at % in any region corresponding to 90% or more of the thickness of the layer,
the atomic ratio of the content of oxygen atoms to the total amount of silicon atoms, oxygen atoms and carbon atoms is 45 to 67 at % in any region corresponding to 90% or more of the thickness of the layer, and
the atomic ratio of the content of carbon atoms to the total amount of silicon atoms, oxygen atoms and carbon atoms is 3 to 25 at % in any region corresponding to 90% or more of the thickness of the layer; and
(ii) the carbon distribution curve has at least one extremum; and
(iii) the absolute value of the difference between the maximum value and the minimum value of the atomic ratio of carbon in the carbon distribution curve is 5 at % or greater,
wherein the at least one extremum of the carbon distribution curve is a local maximum or a local minimum of the atomic ratio of carbon with respect to the distance from a surface of the thin film layer in the film thickness direction of the thin film layer,
the local maximum is a point at which change of the value of the atomic ratio of carbon turns from increase to decrease when the distance from the surface of the thin film layer is changed and the value of the atomic ratio of carbon decreases by 3 at % or more in comparison to the value of the atomic ratio of carbon at a point when the distance from the surface of the thin film layer in the film thickness direction of the thin film layer is further changed by 20 nm, and
the local minimum is a point at which the change of the value of the atomic ratio of carbon turns from decrease to increase when the distance from the surface of the thin film layer is changed and the value of the atomic ratio of carbon increases by 3 at % or more in comparison to the value of the atomic ratio of carbon at a point when the distance from the surface of the thin film layer in the film thickness direction of the thin film layer is further changed by 20 nm.

2. The gas-barrier multilayer film according to claim 1, wherein
the carbon distribution curve of said at least one layer of the thin film layer(s) is substantially continuous.

3. The gas-barrier multilayer film according to claim 1, wherein
the oxygen distribution curve of said at least one layer of the thin film layer(s) has at least one extremum.

4. The gas-barrier multilayer film according to claim 1, wherein
the absolute value of the difference between the maximum value and the minimum value of the atomic ratio of oxygen in the oxygen distribution curve of said at least one layer of the thin film layer(s) is 5 at % or greater.

5. The gas-barrier multilayer film according to claim 1, wherein
the absolute value of the difference between the maximum value and the minimum value of the atomic ratio of silicon in the silicon distribution curve of said at least one layer of the thin film layer(s) is smaller than 5 at %.

6. The gas-barrier multilayer film according to claim 1, wherein
the absolute value of the difference between the maximum value and the minimum value of the total atomic ratio of oxygen and carbon in an oxygen-carbon distribution curve is smaller than 5 at %, the oxygen-carbon distribution curve representing the relationship between the distance from the surface in the film thickness direction of said at least one layer of the thin film layer(s) and the ratio of the total amount of oxygen atoms and carbon atoms to the total amount of silicon atoms, oxygen atoms, and carbon atoms (the atomic ratio of oxygen and carbon).

7. The gas-barrier multilayer film according to claim 1, wherein
the carbon distribution curve of said at least one layer of the thin film layer(s) has at least three extrema.

8. The gas-barrier multilayer film according to claim 1, wherein
the carbon distribution curve of said at least one layer of the thin film layer(s) has at least three extrema, and
the absolute value of the difference in distance from the surface of the thin film layer in the film thickness direction of the thin film layer between each of the extrema of the carbon distribution curve and any one of the extrema adjacent to the former one is 200 nm or less.

9. The gas-barrier multilayer film according to claim 1, wherein
the oxygen distribution curve of said at least one layer of the thin film layer(s) has at least three extrema.

10. The gas-barrier multilayer film according to claim 1, wherein
the oxygen distribution curve of said at least one layer of the thin film layer(s) has at least three extrema, and
the absolute value of the difference in distance from the surface of the thin film layer in the film thickness direction of the thin film layer between each of the extrema of the oxygen distribution curve and any one of the extrema adjacent to the former one is 200 nm or less.

11. The gas-barrier multilayer film according to claim 1, wherein
said at least one layer of the thin film layer(s) further satisfies the following requirement (B):
[Requirement (B)]
an electron beam transmittance curve has at least one extremum, the electron beam transmittance curve representing the relationship between the distance from a surface of the layer in the film thickness direction of the layer and the electron beam transmittance; and
the electron beam transmittance curve of said layer is substantially continuous.

12. The gas-barrier multilayer film according to claim 1, wherein
said at least one layer of the thin film layer(s) further satisfies the following requirement (B):
[Requirement (B)]
an electron beam transmittance curve has at least one extremum, the electron beam transmittance curve representing the relationship between the distance from a surface of the layer in the film thickness direction of the layer and the electron beam transmittance; and
the electron beam transmittance curve of said layer has at least three extrema.

13. The gas-barrier multilayer film according to claim 1, wherein
said at least one layer of the thin film layer(s) further satisfies the following requirement (B):
[Requirement (B)]
an electron beam transmittance curve has at least one extremum, the electron beam transmittance curve representing the relationship between the distance from a surface of the layer in the film thickness direction of the layer and the electron beam transmittance;
the electron beam transmittance curve of said layer has at least three extrema, and
the absolute value of the difference in distance from the surface of the thin film layer in the film thickness direction of the thin film layer between each of the extrema of the electron beam transmittance curve and any one of the extrema adjacent to the former one is 200 nm or less.

14. The gas-barrier multilayer film according to claim 1, wherein
said at least one layer of the thin film layer(s) further satisfies the following requirement (B):
[Requirement (B)]
an electron beam transmittance curve has at least one extremum, the electron beam transmittance curve representing the relationship between the distance from a surface of the layer in the film thickness direction of the layer and the electron beam transmittance; and
said layer contains silicon oxide as a main component.

15. The gas-barrier multilayer film according to claim 14, wherein
said layer contains substantially no nitrogen.

16. The gas-barrier multilayer film according to claim 1, wherein
said at least one layer of the thin film layer(s) further satisfies the following requirement (B):
[Requirement (B)]
an electron beam transmittance curve has at least one extremum, the electron beam transmittance curve representing the relationship between the distance from a surface of the layer in the film thickness direction of the layer and the electron beam transmittance; and
said layer contains silicon nitride as a main component.

17. The gas-barrier multilayer film according to claim 1, wherein
said at least one layer of the thin film layer(s) further satisfies the following requirement (B):
[Requirement (B)]
an electron beam transmittance curve has at least one extremum, the electron beam transmittance curve representing the relationship between the distance from a surface of the layer in the film thickness direction of the layer and the electron beam transmittance; and
said layer contains carbon.

18. The gas-barrier multilayer film according to claim 1, wherein
said at least one layer of the thin film layer(s) has a thickness of 5 to 3000 nm.

19. The gas-barrier multilayer film according to claim 1, wherein
said at least one layer of the thin film layer(s) is a layer formed by a plasma enhanced chemical vapor deposition method.

20. The gas-barrier multilayer film according to claim 1, wherein
said at least one of the thin film layers is a layer formed by a plasma enhanced chemical vapor deposition method in which the base member is placed on a pair of film forming rolls and plasma is generated by performing discharge between the pair of film forming rolls.

21. The gas-barrier multilayer film according to claim 20, wherein
the polarities of the pair of film forming rolls are reversed alternately during the discharge between the pair of film forming rolls.

22. The gas-barrier multilayer film according to claim 19, wherein a film-forming gas to be used in the plasma enhanced chemical vapor deposition method contains an organosilicon compound and oxygen.

23. The gas-barrier multilayer film according to claim 22, wherein
the content of the oxygen in the film-forming gas is not more than a theoretical amount of oxygen necessary to completely oxidize the entire amount of the organosilicon compound in the film-forming gas.

24. The gas-barrier multilayer film according to claim 1, wherein
said at least one layer of the thin film layer(s) is a layer formed by a continuous film formation process.

25. The gas-barrier multilayer film according to claim 1, wherein
the base member is made of at least one resin selected from the group consisting of polyester-based resins and polyolefin-based resins.

26. The gas-barrier multilayer film according to claim 1, wherein
the base member is made of at least one resin selected from the group consisting of polyethylene terephthalate and polyethylene naphthalate.

27. An organic electroluminescent element comprising the gas-barrier multilayer film according to claim 1.

28. An organic thin film solar cell comprising the gas-barrier multilayer film according to claim 1.

29. A liquid crystal display comprising the gas-barrier multilayer film according to claim 1.

* * * * *